(12) United States Patent
Thomas et al.

(10) Patent No.: US 7,759,199 B2
(45) Date of Patent: Jul. 20, 2010

(54) STRESSOR FOR ENGINEERED STRAIN ON CHANNEL

(75) Inventors: Shawn Thomas, Gilbert, AZ (US); Pierre Tomasini, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 19 days.

(21) Appl. No.: 11/858,054

(22) Filed: Sep. 19, 2007

(65) Prior Publication Data

US 2009/0075029 A1    Mar. 19, 2009

(51) Int. Cl.
*H01L 21/336* (2006.01)

(52) U.S. Cl. .................. 438/269; 438/300; 438/360; 438/429; 257/E21.43; 257/E21.461; 257/E21.634

(58) Field of Classification Search .............. 438/245, 438/269, 300, 341, 360, 388, 413, 429, 481; 257/E21.09, E21.619, E21.634, E21.43, E21.461
See application file for complete search history.

(56) References Cited

U.S. PATENT DOCUMENTS

| | | | |
|---|---|---|---|
| 4,058,430 A | 11/1977 | Suntola et al. | |
| 4,210,925 A | 7/1980 | Morcom et al. | |
| 4,413,022 A | 11/1983 | Suntola et al. | |
| 4,578,142 A | 3/1986 | Corboy, Jr. et al. | |
| 4,698,316 A | 10/1987 | Corboy, Jr. et al. | |
| 4,704,186 A | 11/1987 | Jastrzebski | |
| 4,710,241 A | 12/1987 | Komatsu | |
| 4,728,623 A | 3/1988 | Lu | |
| 4,735,918 A | 4/1988 | Parsons | |
| 4,747,367 A | 5/1988 | Posa | |
| 4,749,440 A | 6/1988 | Blackwood et al. | |
| 4,749,441 A | 6/1988 | Christenson | |
| 4,758,531 A | 7/1988 | Beyer | |
| 4,761,269 A | 8/1988 | Conger et al. | |
| 4,778,775 A | 10/1988 | Tzeng | |
| 4,786,615 A | 11/1988 | Liaw | |
| 4,793,872 A | 12/1988 | Meunier | |
| 4,834,809 A | 5/1989 | Kakihara | |
| 4,857,479 A | 8/1989 | McLaughlin | |
| 4,870,030 A | 9/1989 | Markunas et al. | |

(Continued)

FOREIGN PATENT DOCUMENTS

DE    19820147 A1    7/1999

(Continued)

OTHER PUBLICATIONS

Abeles et al.; *Amorphous Semiconductor Superlattices*; Physical Review Letters; Nov. 21, 1983; pp. 2003-2006; vol. 51; No. 21.

(Continued)

*Primary Examiner*—Khiem D Nguyen
(74) *Attorney, Agent, or Firm*—Knobbe, Martens, Olson & Bear LLP

(57) ABSTRACT

A semiconductor substrate having recesses filled with heteroepitaxial silicon-containing material with different portions having different impurity concentrations. Strained layers can fill recessed source/drain regions in a graded, bottom-up fashion. Layers can also line recess sidewalls with one concentration of strain-inducing impurity and fill the remainder to the recess with a lower concentration of the impurity. In the latter case, the sidewall liner can be tapered.

15 Claims, 10 Drawing Sheets

U.S. PATENT DOCUMENTS

| | | | |
|---|---|---|---|
| 4,873,205 A | 10/1989 | Critchlow | |
| 4,891,092 A | 1/1990 | Jastrzebski | |
| 4,897,366 A | 1/1990 | Smeltzer | |
| 4,923,826 A | 5/1990 | Jastrzebski | |
| 4,966,861 A | 10/1990 | Mieno | |
| 4,981,811 A | 1/1991 | Feygenson | |
| 5,004,705 A | 4/1991 | Blackstone | |
| 5,011,789 A | 4/1991 | Burns | |
| 5,028,973 A | 7/1991 | Bajor | |
| 5,037,775 A | 8/1991 | Reisman | |
| 5,045,494 A | 9/1991 | Choi | |
| 5,059,544 A | 10/1991 | Burghartz | |
| 5,061,644 A | 10/1991 | Yue | |
| 5,061,655 A | 10/1991 | Ipposhi | |
| 5,071,670 A | 12/1991 | Kelly | |
| 5,112,439 A | 5/1992 | Reisman | |
| 5,129,958 A | 7/1992 | Nagashima et al. | |
| 5,144,376 A | 9/1992 | Kweon | |
| 5,146,304 A | 9/1992 | Yue | |
| 5,148,604 A | 9/1992 | Bantien | |
| 5,158,644 A | 10/1992 | Cheung et al. | |
| 5,164,813 A | 11/1992 | Blackstone et al. | |
| 5,175,121 A | 12/1992 | Choi et al. | |
| 5,182,619 A | 1/1993 | Pfiester | |
| 5,201,995 A | 4/1993 | Reisman et al. | |
| 5,211,796 A | 5/1993 | Hansen | |
| 5,234,857 A | 8/1993 | Kim et al. | |
| 5,236,546 A | 8/1993 | Mizutani | |
| 5,252,841 A | 10/1993 | Wen et al. | |
| 5,269,876 A | 12/1993 | Mizutani | |
| 5,282,926 A | 2/1994 | Trah et al. | |
| 5,285,089 A | 2/1994 | Das | |
| 5,306,666 A | 4/1994 | Izumi | |
| 5,319,220 A | 6/1994 | Suzuki et al. | |
| 5,323,032 A | 6/1994 | Sato et al. | |
| 5,324,679 A | 6/1994 | Kim et al. | |
| 5,326,992 A | 7/1994 | Yoder | |
| 5,356,510 A | 10/1994 | Pribat et al. | |
| 5,373,806 A | 12/1994 | Logar | |
| 5,378,901 A | 1/1995 | Nii | |
| 5,380,370 A | 1/1995 | Niino et al. | |
| 5,403,434 A | 4/1995 | Moslehi | |
| 5,403,751 A | 4/1995 | Nishida et al. | |
| 5,416,354 A | 5/1995 | Blackstone | |
| 5,421,957 A | 6/1995 | Carlson et al. | |
| 5,422,302 A | 6/1995 | Yonehara et al. | |
| 5,422,502 A | 6/1995 | Kovacic | |
| 5,425,842 A | 6/1995 | Zijlstra | |
| 5,470,799 A | 11/1995 | Itoh et al. | |
| 5,496,745 A | 3/1996 | Ryum et al. | |
| 5,508,536 A | 4/1996 | Twynam et al. | |
| 5,512,772 A | 4/1996 | Maeda et al. | |
| 5,517,943 A | 5/1996 | Takahashi | |
| 5,557,117 A | 9/1996 | Matsuoka et al. | |
| 5,557,118 A | 9/1996 | Hashimoto | |
| 5,563,085 A | 10/1996 | Kohyama | |
| 5,591,492 A | 1/1997 | Hirai et al. | |
| 5,609,721 A | 3/1997 | Tsukune et al. | |
| 5,670,801 A | 9/1997 | Nakano | |
| 5,674,781 A | 10/1997 | Huang et al. | |
| 5,693,147 A | 12/1997 | Ward et al. | |
| 5,711,811 A | 1/1998 | Suntola et al. | |
| 5,729,033 A | 3/1998 | Hafizi | |
| 5,766,999 A | 6/1998 | Sato | |
| 5,769,950 A | 6/1998 | Takasu et al. | |
| 5,783,495 A | 7/1998 | Li et al. | |
| 5,798,278 A | 8/1998 | Chan et al. | |
| 5,831,335 A | 11/1998 | Miyamoto | |
| 5,859,447 A | 1/1999 | Yang et al. | |
| 5,879,459 A | 3/1999 | Gadgil et al. | |
| 5,899,752 A | 5/1999 | Hey et al. | |
| 5,904,565 A | 5/1999 | Nguyen et al. | |
| 5,916,365 A | 6/1999 | Sherman | |
| 5,926,743 A | 7/1999 | Xi et al. | |
| 5,933,761 A | 8/1999 | Lee | |
| 5,967,794 A | 10/1999 | Kodama | |
| 5,986,287 A | 11/1999 | Eberl et al. | |
| 5,998,305 A | 12/1999 | Holmer et al. | |
| 6,031,255 A | 2/2000 | Delage et al. | |
| 6,037,258 A | 3/2000 | Liu et al. | |
| 6,042,654 A | 3/2000 | Comita et al. | |
| 6,043,519 A | 3/2000 | Shealy et al. | |
| 6,048,790 A | 4/2000 | Iacoponi et al. | |
| 6,049,098 A | 4/2000 | Sato | |
| 6,057,200 A | 5/2000 | Prall et al. | |
| 6,058,945 A | 5/2000 | Fujiyama et al. | |
| 6,060,397 A | 5/2000 | Seamons et al. | |
| 6,069,068 A | 5/2000 | Rathore et al. | |
| 6,074,478 A | 6/2000 | Oguro | |
| 6,077,775 A | 6/2000 | Stumborg et al. | |
| 6,083,818 A | 7/2000 | Stumborg et al. | |
| 6,093,368 A | 7/2000 | Chu et al. | |
| 6,100,184 A | 8/2000 | Zhao et al. | |
| 6,139,700 A | 10/2000 | Kang et al. | |
| 6,146,517 A | 11/2000 | Hoinkis | |
| 6,153,010 A | 11/2000 | Kiyoku et al. | |
| 6,164,295 A | 12/2000 | Ui et al. | |
| 6,181,012 B1 | 1/2001 | Edelstein et al. | |
| 6,184,128 B1 | 2/2001 | Wang et al. | |
| 6,188,134 B1 | 2/2001 | Stumborg et al. | |
| 6,190,453 B1 | 2/2001 | Boydston et al. | |
| 6,190,976 B1 | 2/2001 | Shishiguchi et al. | |
| 6,200,893 B1 | 3/2001 | Sneh | |
| 6,203,613 B1 | 3/2001 | Gates et al. | |
| 6,207,487 B1 | 3/2001 | Kim et al. | |
| 6,207,567 B1 | 3/2001 | Wang et al. | |
| 6,221,168 B1 | 4/2001 | Carter et al. | |
| 6,225,213 B1 | 5/2001 | Urabe | |
| 6,225,650 B1 | 5/2001 | Tadatomo et al. | |
| 6,235,568 B1 | 5/2001 | Murthy et al. | |
| 6,270,572 B1 | 8/2001 | Kim et al. | |
| 6,287,965 B1 | 9/2001 | Kang et al. | |
| 6,291,876 B1 | 9/2001 | Stumborg et al. | |
| 6,303,523 B2 | 10/2001 | Cheung et al. | |
| 6,316,795 B1 | 11/2001 | Croke, III | |
| 6,335,251 B2 | 1/2002 | Miyano et al. | |
| 6,340,619 B1 | 1/2002 | Ko | |
| 6,342,448 B1 | 1/2002 | Lin et al. | |
| 6,343,183 B1 | 1/2002 | Halpin et al. | |
| 6,348,096 B1 | 2/2002 | Sunakawa et al. | |
| 6,348,098 B1 | 2/2002 | McLoughlin et al. | |
| 6,351,039 B1 | 2/2002 | Jin et al. | |
| 6,358,829 B2 | 3/2002 | Yoon et al. | |
| 6,368,954 B1 | 4/2002 | Lopatin et al. | |
| 6,376,318 B1 | 4/2002 | Lee et al. | |
| 6,380,065 B1 | 4/2002 | Komai et al. | |
| 6,391,785 B1 | 5/2002 | Satta et al. | |
| 6,391,796 B1 | 5/2002 | Akiyama et al. | |
| 6,444,495 B1 | 9/2002 | Leung et al. | |
| 6,454,854 B1 | 9/2002 | Ose | |
| 6,482,733 B2 | 11/2002 | Raaijmakers et al. | |
| 6,555,839 B2 | 4/2003 | Fitzgerald | |
| 6,555,845 B2 | 4/2003 | Sunakawa et al. | |
| 6,566,279 B2 | 5/2003 | Suemitsu et al. | |
| 6,583,015 B2 | 6/2003 | Fitzgerald et al. | |
| 6,593,191 B2 | 7/2003 | Fitzgerald | |
| 6,593,211 B2 | 7/2003 | Sato | |
| 6,657,223 B1 * | 12/2003 | Wang et al. | 257/19 |
| 6,727,169 B1 | 4/2004 | Raaijmakers et al. | |
| 6,821,825 B2 | 11/2004 | Todd et al. | |
| 6,881,633 B2 * | 4/2005 | Hokazono | 438/285 |
| 6,900,115 B2 | 5/2005 | Todd | |
| 6,969,875 B2 | 11/2005 | Fitzgerald | |
| 6,974,730 B2 * | 12/2005 | Diaz et al. | 438/163 |

| | | | |
|---|---|---|---|
| 6,998,305 | B2 | 2/2006 | Arena et al. |
| 7,108,748 | B2 | 9/2006 | Brabant et al. |
| 7,176,481 | B2 * | 2/2007 | Chen et al. ............... 257/19 |
| 7,312,128 | B2 | 12/2007 | Kim |
| 7,335,959 | B2 * | 2/2008 | Curello et al. ............... 257/408 |
| 7,405,131 | B2 * | 7/2008 | Chong et al. ............... 438/300 |
| 2001/0001742 | A1 | 5/2001 | Huang et al. |
| 2001/0034123 | A1 | 10/2001 | Jeon et al. |
| 2001/0046766 | A1 | 11/2001 | Asakawa |
| 2002/0023520 | A1 | 2/2002 | Hu |
| 2002/0168868 | A1 | 11/2002 | Todd |
| 2003/0036268 | A1 | 2/2003 | Brabant et al. |
| 2003/0082300 | A1 | 5/2003 | Todd et al. |
| 2004/0171238 | A1 | 9/2004 | Arena et al. |
| 2004/0224089 | A1 | 11/2004 | Singh et al. |
| 2004/0262694 | A1 | 12/2004 | Chidambaram |
| 2005/0079692 | A1 | 4/2005 | Samoilov et al. |
| 2005/0250298 | A1 | 11/2005 | Bauer |
| 2006/0011984 | A1 | 1/2006 | Currie |
| 2006/0014366 | A1 | 1/2006 | Currie |
| 2006/0115933 | A1 | 6/2006 | Ye et al. |
| 2006/0166414 | A1 | 7/2006 | Carlson et al. |
| 2006/0169668 | A1 | 8/2006 | Samoilov |
| 2006/0169669 | A1 | 8/2006 | Zojaji et al. |
| 2006/0205194 | A1 | 9/2006 | Bauer |
| 2006/0228842 | A1 * | 10/2006 | Zhang et al. ............... 438/184 |
| 2006/0234504 | A1 | 10/2006 | Bauer et al. |
| 2006/0240630 | A1 | 10/2006 | Bauer et al. |
| 2006/0289900 | A1 | 12/2006 | Thirupapuliyur et al. |
| 2007/0287272 | A1 * | 12/2007 | Bauer et al. ............... 438/485 |
| 2009/0075447 | A1 | 3/2009 | Meunier-Beillard |

FOREIGN PATENT DOCUMENTS

| | | |
|---|---|---|
| WO | WO 96/17107 | 6/1996 |
| WO | WO 99/41423 | 8/1999 |
| WO | WO 99/62109 | 12/1999 |
| WO | WO 00/11721 | 3/2000 |
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 A3 | 12/2000 |
| WO | WO 00/79576 A1 | 12/2000 |
| WO | WO 01/15220 A1 | 3/2001 |
| WO | WO 01/36702 A1 | 5/2001 |
| WO | WO 01/45149 A1 | 6/2001 |
| WO | WO 01/66832 A3 | 9/2001 |
| WO | WO 01/78123 A1 | 10/2001 |
| WO | WO 01/78124 A1 | 10/2001 |
| WO | WO 01/99166 A1 | 12/2001 |

OTHER PUBLICATIONS

Antonell et al., "Carbon incorporation for strain compensation during solid phase epitaxial recrystallization of SiGe on Si at 500-600° C", J. Appl. Phys. 79 (10), pp. 7646-7651 (1996).

Aoyama et al, "Segregation of interface carbon during silicon epitaxial growth by UHV-CVD", Journal of Crystal Growth, 157, pp. 323-326 (1995).

Aoyama et al, "Si selective epitaxial growth using $Cl_2$ pulsed molecular flow method", Thin Solid Films, 321, pp. 256-260 (1998).

Bauer et al, "$Si_3H_8$ based epitaxy of biaxially stressed silicon films doped with carbon and arsenic for CMOS applications", in Semiconductor Defect Engineering—Materials, Synthetic Structures and Devices, edited by S. Ashok et al, (Mater. Res. Soc. Symp. Proc. 864, Warrendale, PA, 2005), E4.30.

Bauer et al, "Tensile strained selective silicon carbon alloys for recessed source drain areas of devices", Meeting Abstract, Electrochem. Soc., 602, p. 1414 (2006).

Bauer et al., "Time resolved reflectivity measurements of silicon solid phase epitaxial regrowth", Thin Solid Films 364, pp. 228-232 (2000).

Bedair; Selective area and sidewall growth by atomic layer epitaxy; Semicond Sci. Technol; 1993; 1052-1062; vol. 8.

Berti et al, "Lattice parameter in $Si_{1-y}C_y$ epilayers: Deviation from Vegard's rule", Applied Physics Letters, 72(13), pp. 1602-1604 (Mar. 30, 1998).

Bogumilowicz et al, "Chemical vapour etching of Si, SiGe and Ge with HCl; applications to the formation of thin relaxed SiGe buffers and to the revelation of threading dislocations", Semicond. Sci. Technol., 20, pp. 127-134 (2005).

Celotti et al, "Lattice parameter study of silicon uniformly doped with boron and phosphorus", Journal of Materials Science, 9(5), pp. 821-828 (May 1974).

Develyn et al, "Adsorption, desorption, and decomposition of HCl and HBr on Ge(100)—Competitive pairing and near-first-order desorption-kinetics", Journal of Chemical Physics, 101(3), pp. 2463-2475 (1994).

Düscö et al.; Deposition of Tin Oxide into Porous Silicon by Atomic Layer Epitaxy; J. Electrochem. Soc.; Feb. 1996; pp. 683-687; vol. 143, No. 2.

Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).

Fazan et al.; A High-C Capacitor (20.4 Ff/µm2) with Ultrathin CVD—Ta2O5 Films Deposited on Rugged Poly-Si for High Density DRAMs; IEEE; 1992; pp. IDEM 92-263-IDEM 92-266.

Feng et al., "Raman determination of layer stresses and strains for heterostructures and its application to the cubic SiC/Si system", J. Appl. Phys. 64 (12), pp. 6827-6835 (1988).

George et al.; Nucleation and Growth During Tungsten Atomic Layer Deposition on Oxide Surfaces; Mat. Res. Symp. Proc. vol. 672; Materials Research Society 2001; 07.7.1-07.7.7.

Goesele et al, "Diffusion Engineering By Carbon In Silicon", in Si Front-End Processing Physics and Technology of Dopant-Defect Interactions II, edited by A. Agarwal et al, (Mater. Res. Soc. Symp. Proc. 610, San Francisco CA, 2000), B7.1.

Han et al, "Novel Enhanced Stressor with Graded Embedded SiGe Source/Drain for High Performance CMOS Devices", Electron Devices Meeting, IEDM '06 International, pp. 1-4 (San Francisco, Dec. 2006).

Hartmann et al, "High C content $Si/Si_{1-y}C_y$ heterostructures for n-type metal oxide semiconductor transistors", Semicond. Sci. Technol., 19, pp. 593-601 (2004).

Haukka et al.; Chemisorption of chromium acetylacetonate on porous high surface area silica; Applied Surface Science; 1994; pp. 220-227.

Hiltunen et al.; Nitrides of Titanium, Niobium, Tantalum and Molybdenum Grown as Thin Films by the Atomic Layer Epitaxy Method; Thin Solid Films; 1988; pp. 149-154; vol. 166.

Horiike et al.; Filling of Si Oxide into a Deep Trench using Digital CVD Method; Applied Surface Science; 1990; pp. 168-174; vol. 46.

Hoyt, "Substitutional carbon incorporation and electronic characterization of $Si_{1-y}C_y$/Si and $Si_{1-x-y}Ge_xC_y$/Si heterojunctions", Chapter 3 in Silicon-Germanium Carbon Alloy, Taylor and Francis, pp. 59-89 (New York 2002).

Ito et al, "Mechanical Stress Effect of Etch-Stop Nitride and its Impact on Deep Submicron Transistor Design", Electron Devices Meeting, IEDM Technical Digest International, pp. 247-250 (San Francisco, Dec. 2000).

Iyer et al, "Synthesis of $Si_{1-y}C_y$ alloys by molecular beam epitaxy", Applied Physics Letters, 60(3), pp. 356-358 (Jan. 20, 1992).

Jin et al.; Porous Silica Xerogel Processing and Integration for ULSI Applications; Materials Research Society Symposium Proceedings; 1998; pp. 213-222; vol. 511.

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Juppo et al.; Deposition of copper films by an alternate supply of CuCl and Zn; J. Vac. Sci. Technol.; 1997; pp. 2003; vol.-issue A 15(4).

Kaizuka et al.; *Conformal Chemical Vapor Deposition TiN(111) Film Formation as an Underlayer of Al for Highly Reliable Interconnects*; Jpn. J. Appl. Phys.; 1994; pp. 470-474; vol. 33.

Kelires, "Monte Carlo studies of ternary semiconductor alloys: application to the $Si_{1-x-y}Ge_xC_y$ system", *Physical Review B*, 75, pp. 1114-1117 (Aug. 7, 1995).

Kelires, "Short-range order, bulk moduli, and physical trends in c-$Si_{1-x}C_x$ alloys", *Physical Review B*, 55, pp. 8784-8787 (Apr. 1, 1997).

Kikkawa et al.; *A Quarter-Micrometer Interconnection Technology Using a TiN/Al-Si-Cu/TiN/Al-Si-Cu/TiN/Ti Multilayer Structure*; IEEE Transactions on Electron Devices; Feb. 1993; pp. 296-302; vol. 40, No. 2.

Kikkawa et al.; *Al-Si-Cu/TiN multilayer interconnection and Al-Ge reflow sputtering technologies for quarter-micron devices*; SPIE; 1992; pp. 54-64; vol. 1805.

Kim et al.; *Applicability of ALE Tin films as Cu/Si diffusion barriers*; Thin Solid Films; 2000; pp. 276-283; 372(1).

Kim et al.; *Comparison of TiN and TiAlN as a Diffusion Barrier Deposited by Atomic Layer Deposition*; Journal of the Korean Physical Society; 2002; pp. 176-179; 40(1).

Kim et al, "Low Temperature Selective Si Epitaxy by Reduced Pressure Chemcial Vapor Deposition Introducing Periodic Deposition and Etching Cycles with $SiH_4$, $H_2$ and HCl", Mat. Res. Soc. Symp. Proc., vol. 609, pp. A8.2.1-A8.2.6 (2000).

Klaus et al.; *Atomic Layer Deposition of SiO2 Using Catalyzed and Uncatalyzed Self-Limiting Surface Reactions*; Surface Review and Letters; 1999; pp. 435-448; vol. 6, Nos. 3 & 4.

Klaus et al.; *Atomic Layer Deposition of Tungsten Nitride Films Using Sequential Surface Reactions*; J. Electrochem Soc.; 2000; 1175-1181; 147(3).

Klaus et al.; *Atomically controlled growth of tungsten and tungsten nitride using sequential surface reactions*; Applied Surface Science; 2000; pp. 479-491; vols. 162-163.

Koo et al.; *Study on the characteristics of Ti AlN thin film deposited by atomic layer deposition method*; Journal of Vacuum Science & Technology, A: Vacuum Surfaces, and Films; 2001; 2931-2834; 19(6).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58.

Kukli et al.; *Atomic Layer Epitaxy Growth of Tantalum Oxide Thin Films from Ta(OC2H5)5 and H2O*; J. Electrochem. Soc.; May 1995; pp. 1670-1674; vol. 142, No. 5.

Leskelä et al.; *Atomic Layer Epitaxy in Deposition of Various Oxide and Nitride Thin Films*; Journal De Physique IV, Colloque C5, supplement au Journal de Physique II; Jun. 1995; pp. C5-937-C5-951; vol. 5.

Lin et al, "Chlorine-induced Si surface segregation on the Ge-terminated Si/Ge(100) surface from core-level photoemission", *Physical Review B*, 64, 233302 (2001).

Lin at el, "Atomistics of Ge deposition on Si(100) by atomic layer epitaxy", *Physical Review Letters*, 90(4), 046102 (Jan. 31, 2003).

MacKnight et al., "RTP applications and technology options for the sub-45 nm node", Proceedings, RTP2004 Conference (Portland, OR) (2004).

Martensson et al.; *Atomic layer epitaxy of copper an ab inition investigation of the CuCl/H2 process III. Reaction barriers*; Appl. Surf. Sci.; 2000; 92-100; 157(1).

Martensson et al.; *Atomic Layer Epitaxy of Copper on Tantalum*; Chemical Vapor Deposition; 1997; pp. 45-50; vol. 3, No. 1.

Martensson et al.; *Atomic Layer Epitaxy of Copper, Growth and Selectivity in the Cu(II)-2,2,6, 6-tetramethyl-3,5-heptanedionate/H2 Process*; J. Electrochem. Soc.; Aug. 1998; pp. 2926-2931; vol. 145, No. 8.

Martensson et al.; *CU(THD)2 as Copper Source in Atomic Layer Epitaxy*; Proc. Electrochem. Soc.; 1997; 1529-1536; 97-25.

Martensson et al.; *Use of Atomic Layer Epitaxy for Fabrication of Si/TiN/Cu Structures*; J. Vac. Sci. Technol. B, Sep./Oct. 1999; pp. 2122-2128; vol. 17, No. 5.

McVay et al, "The diffusion of germanium in silicon", *Journal of Applied Physics*, 44(3), pp. 1409-1410 (Mar. 1973).

McVay et al, "Diffusion of Ge in SiGe alloys", *Physical Review B*, 9, 627-631 (Jan. 1974).

Meléndez-Lira et al., "Substitutional carbon in $Si_{1-y}C_y$ alloys as measured with infrared absorption and Raman spectroscopy", J. Appl. Phys. 82, pp. 4246-4252 (1997).

Min et al.; *Atomic Layer Deposition of TiN Films by Alternate Supply of Tetrakis (ethylmethylamino)-Titanium and Ammonia*; Japanese Journal of Applied Physics; 1998; pp. 4999-5004; vol. 37.

Min et al.; *Chemical Vapor Deposition of Ti-Si-N Films with Alternating Source Supply*; Mat. Res. Soc. Symp. Proc.; 1999; pp. 207-210; vol. 564; Materials Research Society.

Min et al.; *Metal-Organic Atomic-Layer Deposition of Titanium-Silicon-Nitride Films*; Applied Physics Letters; 1999; pp. 1521-1523; vol. 75, No. 11.

Min; *Atomic Layer Deposition of TiN Thin Films by Sequential Introduction of Ti Precursor and NH3*; Materials Research Society Symposium Proceedings; 1998; pp. 337-343; vol. 514.

Mitchell et al, "Germanium diffusion in polysilicon emitters of SiGe heterojunction bipolar transistors fabricated by germanium implantation", *Journal of Applied Physics*, 92(11), pp. 6924-6926 (Dec. 1, 2002).

Moller; *Copper and Nickel Ultrathin Films on Metal-Oxide Crystal Surfaces* Mater. Soc. Monogr.; 1994; 473-522; 81.

Nakahata et al, "Low thermal budge surface cleaning after dry etching for selective silicon epitaxial growth", *Journal of Crystal Growth*, 226, pp. 443-450 (2001).

Nakahata et al, "Formation of selective epitaxially grown silicon with a flat edge by ultra-high vacuum chemical vapor deposition", *Journal of Crystal Growth*, 233, pp. 82-87 (2001).

Nakahata et al, "Optimization of process conditions of selective epitaxial growth for elevated source/drain CMOS transistor", *Journal of Crystal Growth*, 243, pp. 87-93 (2002).

Nakahata et al, "Low thermal budget selective epitaxial growth for formation of elevated source/drain MOS transistors", *Journal of Crystal Growth*, 264, pp. 79-85 (2004).

Niinistö et al.; *Synthesis of oxide thin films and overlayers by atomic layer epitaxy for advanced applications*; Materials Science and Engineering; 1996; pp. 23-29; vol. B41.

O'Neil et al., "Optimization of process conditions for selective silicon epitaxy using disilane, hydrogen, and chlorine", J. Electrochem. Soc. 144 (9), pp. 3309-3315 (1997).

Oehme et al., "A novel measurement method of segregating adlayers in MBE", Thin Solid Films 369, pp. 138-142 (2000).

Oehme et al, "Carbon segregation in silicon", *Thin Solid Films*, 380(1-2), pp. 75-77 (Dec. 22, 2000).

Osten et al, "Substitutional versus interstitial carbon incorporation during pseudomorphic growth of $Si_{1-y}C_y$ on Si(001)", *Journal of Applied Physics*, 80(12), pp. 6711-6715 (Dec. 15, 1996).

Osten et al, "Substitutional carbon incorporation in epitaxial $Si_{1-y}C_y$ alloys on Si(001) grown by molecular beam epitaxy", *Applied Physics Letters*, 74(6), pp. 836-838 (Feb. 8, 1999).

Ott et al.; *Modification of Porous Alumina membranes Using Al2O3 Atomic Layer Controlled Deposition*; Chem. Mater.; 1997; pp. 707-714; vol. 9.

PCT Search Report, PCT Application PCT/US2006/003333; Jun. 30, 2006.

PCT Search Report, PCT Application PCT/US2006/003465; Jul. 7, 2006.

Ritala et al.; *Atomic Layer Epitaxy Growth of TiN Thin Films from Tila and NH3*; J. Electrochem. Soc.; Aug. 1998; pp. 2914-2920; vol. 145; No. 8.

Ritala et al.; *Controlled Growth of TaN, Ta3N5, and TaOxNy Thin Filims by Atomic Layer Deposition*; Chem. Mater.; 1999; pp. 1712-1718; vol. 11.

Ritala et al.; *Effects of intermediate zinc pulses on properties of TiN and NbN films deposited by atomic layer epitaxy*; Appl. Surf. Sci.; 1997; 199-212; 120.

Ritala et al.; *Perfectly Conformal TiN and Al2O3 Films Deposited by Atomic Layer Deposition*; Chem Vap. Deposition; 1999; pp. 7-9; vol. 5, No. 1.

Rossnagel et al.; *Plasma-enhanced atomic layer deposition of Ta and Ti for interconnect diffusin barriers*; J. Vac. Sci. Technol.; 2000; 2016-2020; 18(4).

Ryan et al.; *Material Property Characterization and Integration Issues for Mesoporous Silica*; IEEE, 1999, pp. IITC 99-187-IITC 99-189.

Sakaue et al.; *Digital Chemical Vapor Deposition of SiO2 Using a Repetitive Reaction of Triethylsilane/Hydrogen and Oxidation*; Japanese Journal of Applied Physics; Jan. 1990; pp. L124-L127; vol. 30, No. 1B.

Sakurai et al, "Adsorption, diffusion and desorption of Cl atoms on Si(111) surfaces", *Journal of Crystal Growth*, 237-239, pp. 212-216 (2002).

Singer; *Atomic Layer Deposition Targets Thin Films*; Semiconductor International; Sep. 1999; pp. 40.

Sneh et al.; *Atomic layer growth of SiO2 on Si(100) using SiCl4 and H2O in a binary reaction sequence*; Surface Science; 1995; pp. 135-152; vol. 334.

Solanki et al.; *Atomic Layer Deposition of Copper Seed Layers*; Electrochem. and Solid State Lett.; 2000; 479-480; 3(10).

Soman et al, "Selective area chemical vapor deposition of $Si_{1-x}Ge_x$ thin film alloys by the alternating cyclic method: Experimental data: II. Morphology and composition as a function of deposition parameters", *Journal of the Electrochemical Society*, 147(5), pp. 1854-1858 (May 2000).

Soman et al, "Selective area chemical vapor deposition of $Si_{1-x}Ge_x$ thin film alloys by the alternating cyclic method: A thermodynamic analysis: II. The system Si-Ge-Cl-H-Ar", *Journal of the Electrochemical Society*, 147(11), pp. 4342-4344 (Nov. 2000).

Strane et al., "Carbon incorporation into Si at high concentrations by ion implantation and solid phase epitaxy", J. Appl. Phys. 79 (2), pp. 637-646 (1996).

Tiitta et al.; *Preparation and Characterization of Phosphorus-Doped Aluminum Oxide Thin Films*; Materials Research Bulletin; 1998; pp. 1315-1323; vol. 33, No. 9.

U.S. Department of Commerce National Technical Information Service; *Ceramic Coatings on Metals Using Atomic Layer Controlled Chemical Vapor Deposition* (Assert-96); Feb. 16, 2000; Colorado University at Boulder.

Utriainen et al.; *Studies of metallic thin film growth in an atomic layer epitaxy reactor using M(ACAC)2 (M=Ni,Cu,Pt) precursors*; Appl. Surf. Sci.; 2000; 151-158; 157(3).

Van Zant, "Microchip Fabrication", 4th Ed., McGraw Hill (New York, NY), pp. 364-365 (2000).

Violette et al., "On the role of chlorine in selective silicon epitaxy by chemical vapor deposition", J. Electrochem. Soc. 143 (10), pp. 3290-3296 (1996).

Wang; *Spin On Dielectric Films—A General Overview*; 1998 5th International Conference on Solid-State and Integrated Circuit Technology Proceedings; Oct. 21-23, 1998; p. 961; Beijing, China.

Washington et al, "pMOSFET with 200% Mobility Enhancement Induced by Multiple Stressors", IEEE Electron Device Letters, vol. 27, No. 6, pp. 511-513 (Jun. 2006).

Windl et al., "Theory of strain and electronic structure of $Si_{1-y}C_y$ and $Si_{1-x-y}Ge_xC_y$ alloys", Phys. Rev. B57 (4), pp. 2431-2442 (1998).

Wise et al.; *Diethyldiethoxysilane as a New Precursor for SiO2 Growth on Silicon*; Mat. Res. Soc. Symp. Proc.; 1994; pp. 37-43; vol. 334.

Wolansky et al, "Low temperature clean for Si/SiGe epitaxy for CMOS integration of heterojunction bipolar transistors", *Proceedings of the 8th International Symposium on Silicon Materials Science and Technology* 1, pp. 812-821 (1998).

Wolf et al.; *Process and Equipment Simulation of Copper Chemical Vapor Deposition Using Cu(hfac)vtms*; Microelectronic Engineering; 1999; 15-27; 45.

Wolf et al, "Silicon processing for the VLSI era vol. 1: Process technology", Lattice Press, pp. 140-142 and 155-156 (Sunset Beach, CA 1986).

Wolf et al, "Silicon epitaxial growth and silicon on insulator", Chapter 7 in *Silicon Processing for the VLSI Era, vol. 1: Process technology*, 2nd Ed., pp. 225-264 (2000).

Wu et al, "Thermal reactions on the Cl-termination SiGe(100) surface", *Surface Science*, 507-510, pp. 295-299 (2002).

Wu et al, "Stability and mechanism of selective etching of ultrathin Ge films on the Si(100) surface upon chlorine adsorption", *Physical Review B*, 69,045308 (2004).

Yang et al, "Dual Stress Liner for High Performance sub-45nm Gate Length SOI CMOS Manufacturing", Electron Devices Meeting, IEDM Technical Digest International, pp. 1075-1077 (Dec. 2004).

Yagi et al.; *Substitutional C incorporation into Si1—yCy alloys using novel carbon source, 1,3-disilabutane*; Japanese Journal of Applied Physics; 2004; pp. 4153-4154; vol. 43, No. 7A.

Yamamoto et al, "Chemical vapor phase etching of polycrystalline selective to epitaxial Si and SiGe", *Thin Solid Films* 508, pp. 297-300 (2006).

Zhu, "Modeling of germanium and antimony diffusion in $Si_{1-x}Ge_x$", *Electrochemical Society Proceedings*, Jul. 2004, pp. 923-934 (2004).

\* cited by examiner

STRESSOR FOR ENGINEERED STRAIN ON CHANNEL

FIELD OF THE INVENTION

This invention relates generally to the deposition of silicon-containing materials in semiconductor processing, and relates more specifically to epitaxial deposition of silicon-containing materials in recessed source and drain regions of semiconductor substrates.

BACKGROUND OF THE INVENTION

In forming integrated circuits, epitaxial layers are often desired in selected locations, such as active area mesas among field isolation regions, or even more particularly over defined source and drain regions. While non-epitaxial material, which can be amorphous or polycrystalline, can be selectively removed from over the field isolation regions after deposition, it is typically considered more efficient to simultaneously provide chemical vapor deposition ("CVD") and etching chemicals, and to tune conditions to result in zero net deposition over insulating regions and net epitaxial deposition over exposed semiconductor windows. This process, known as selective epitaxial CVD, takes advantage of slow nucleation of typical semiconductor deposition processes on insulators like silicon oxide or silicon nitride. Such selective epitaxial CVD also takes advantage of the naturally greater susceptibility of amorphous and polycrystalline materials to etchants, as compared to the susceptibility of epitaxial layers.

Examples of the many situations in which selective epitaxial formation of semiconductor layers is desirable include a number of schemes for producing strain. The electrical properties of semiconductor materials, such as silicon, carbon-doped silicon, germanium, and silicon germanium alloys, are influenced by the degree to which the materials are strained. For example, semiconductor materials can exhibit enhanced electron mobility under tensile strain, which is particularly desirable for NMOS devices; and enhanced hole mobility under compressive strain, which is particularly desirable for PMOS devices. Methods of enhancing the performance of semiconductor materials are of considerable interest and have potential applications in a variety of semiconductor processing applications. Semiconductor processing is typically used in the fabrication of integrated circuits, which entails particularly stringent quality demands, as well as in a variety of other fields. For example, semiconductor processing techniques are also used in the fabrication of flat panel displays using a wide variety of technologies, as well as in the fabrication of microelectromechanical systems ("MEMS").

A number of approaches for inducing strain in silicon- and germanium-containing materials have focused on exploiting the differences in the lattice constants between various crystalline materials. For example, the lattice constant for crystalline germanium is 5.65 Å, the lattice constant for crystalline silicon is 5.431 Å, and the lattice constant for diamond carbon is 3.567 Å. Heteroepitaxy involves depositing thin layers of a particular crystalline material onto a different crystalline material in such a way that the deposited layer adopts the lattice constant of the underlying crystal material. For example, using this approach, strained silicon germanium layers can be formed by heteroepitaxial deposition onto single crystal silicon substrates. Because the germanium atoms are slightly larger than the silicon atoms and the deposited heteroepitaxial silicon germanium is constrained to the smaller lattice constant of the silicon beneath it, the silicon germanium is compressively strained to a degree that varies as a function of the germanium content. Typically, the band gap for the silicon germanium layer decreases monotonically from 1.12 eV for pure silicon to 0.67 eV for pure germanium as the germanium content in the silicon germanium increases. In another approach, tensile strain is formed in a thin single crystalline silicon layer by heteroepitaxially depositing the silicon layer onto a relaxed silicon germanium layer. In this example, the heteroepitaxially deposited silicon is strained because its lattice constant is constrained to the larger lattice constant of the relaxed silicon germanium beneath it. A tensile strained channel typically exhibits increased electron mobility, and a compressively strained channel exhibits increased hole mobility.

In these examples, strain is introduced into single crystalline silicon-containing materials by replacing silicon atoms with other atoms in the lattice structure. This technique is typically referred to as substitutional doping. For example, substitution of germanium atoms for some of the silicon atoms in the lattice structure of single crystalline silicon produces a compressive strain in the resulting substitutionally doped single crystalline silicon material because the germanium atoms are larger than the silicon atoms that they replace. It is possible to introduce a tensile strain into single crystalline silicon by substitutional doping with carbon because carbon atoms are smaller than the silicon atoms that they replace. Additional details are provided in "Substitutional Carbon Incorporation and Electronic Characterization of $Si_{1-y}C_y$/Si and $Si_{1-x-y}Ge_xC_y$/Si Heterojunctions" by Judy L. Hoyt, Chapter 3 in "Silicon-Germanium Carbon Alloy", Taylor and Francis, pp. 59-89 (New York 2002), referred to herein as "the Hoyt article." However, non-substitutional impurities will not induce strain.

Similarly, electrical dopants should also be substitutionally incorporated into epitaxial layers in order to be electrically active. Either the dopants are incorporated as deposited or the substrate should be annealed to achieve the desired level of substitutionality and dopant activation. In situ doping of either impurities for tailored lattice constant or electrical dopants is often preferred over ex situ doping followed by annealing to incorporate the dopant into the lattice structure because the annealing consumes thermal budget. However, in practice in situ substitutional doping is complicated by the tendency for the dopant to incorporate non-substitutionally during deposition, for example, by incorporating interstitially in domains or clusters within the silicon rather than by substituting for silicon atoms in the lattice structure. Non-substitutional doping complicates, for example, carbon doping of silicon, carbon doping of silicon germanium, and doping of semiconductors with electrically active dopants. As illustrated in FIG. 3.10 at page 73 of the Hoyt article, prior deposition methods have been used to make crystalline silicon having an in situ doped substitutional carbon content of up to 2.3 atomic %, which corresponds to a lattice spacing of over 5.4 Å and a tensile stress of less than 1.0 GPa.

Source and drain recesses can be filled with a silicon-containing alloy as a "stressor" to exert a compressive or tensile strain on the silicon channel between the source and drain. For example, strained epitaxial silicon germanium ("SiGe") in source and drain recesses can exert a compressive strain on the silicon channel and enhance hole mobility. Similarly, a carbon-doped silicon ("Si:C") epitaxial alloy under a tensile strain in source/drain recesses can introduce a tensile strain on the channel and enhance electron mobility. In general, the strain on the channel is related to the concentration of the impurity, such as C or Ge. In other words, the higher the Ge or C content, the higher the strain produced.

SUMMARY OF THE INVENTION

In accordance with an aspect of the invention, a method is provided for selectively forming semiconductor material. A substrate is provided within a chemical vapor deposition chamber. The substrate includes insulating surfaces and single-crystal semiconductor surfaces. The single-crystal semiconductor surfaces include a recess. Semiconductor stressors are selectively formed in the recess. The semiconductor stressor is graded such that an upper portion of the semiconductor stressor within the recess has a higher amount of strain than lower portions and the upper portion extends to sidewalls of the recesses.

In accordance with another aspect of the invention, a method is provided for selectively forming heteroepitaxial semiconductor material. Semiconductor material is deposited over the bottom and sidewall surfaces of a recessed single-crystal semiconductor region of a substrate. Portions of the semiconductor material are selectively removed from the sidewall surfaces of the recessed region while leaving a heteroepitaxial layer of the semiconductor material over the bottom surfaces. Depositing and selectively removing are repeated, wherein a subsequently deposited heteroepitaxial layer of the semiconductor material contains a different concentration of a strain-inducing impurity compared to a previously deposited heteroepitaxial layer of the semiconductor material.

In accordance with another aspect of the invention, a method is provided for forming semiconductor material in a recess. A substrate with insulating regions and the recess formed therein is provided. A liner layer of heteroepitaxial silicon-containing material is deposited in the recess. The liner layer includes a strain-inducing impurity and partially fills the recess. The recess is filled with a filler including silicon-containing material having a lower concentration of the impurity than the liner layer by depositing the filler over the liner layer.

In accordance with another aspect of the invention, a semiconductor device is provided, including a recess in the substrate, a heteroepitaxial liner, a filler, and a transistor channel adjacent the recess. The heteroepitaxial silicon-containing liner covers substantially all single-crystal sidewall surfaces of the recess. The liner includes an impurity that alters a lattice constant. The filler is formed over the liner and fills the recesses. The filler includes a silicon-containing material having a lower concentration of the impurity than the liner over which the filler is formed.

In accordance with yet another aspect of the invention, a semiconductor substrate is provided, comprising a recess, and a transistor channel adjacent the recess. The recess is filled with a heteroepitaxial stressor material. An upper portion of the stressor material within the recess has a first impurity concentration and a lower portion of the stressor material within the recess has a second impurity concentration. The first impurity concentration is higher than the second impurity concentration and the upper portion extends to contact sidewalls of the recess.

BRIEF DESCRIPTION OF THE DRAWINGS

Exemplary embodiments of the methods and systems disclosed herein are illustrated in the accompanying drawings, which are for illustrative purposes only. The drawings include the following figures, in which like numerals indicate like parts.

DETAILED DESCRIPTION OF THE INVENTION

Figure 1:
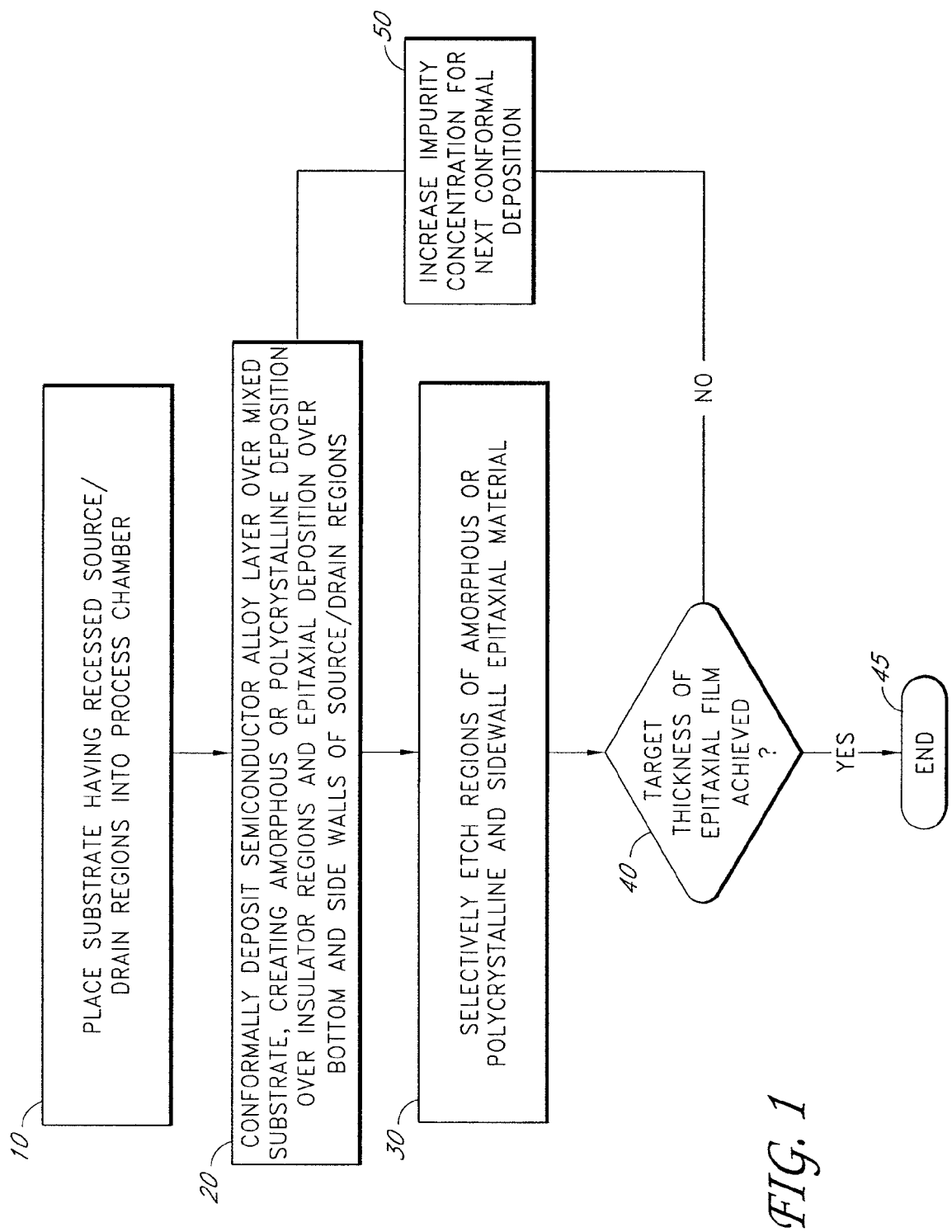
FIG. 1 is a flowchart illustrating a process for selectively forming strained epitaxial semiconductor layers in a bottom-up fashion in recessed source/drain regions of a substrate.

The term "impurity" is used herein to refer to additives, such as germanium or carbon, that alter the semiconductor lattice constant relative to silicon alone; the resultant semiconductor compound is often referred to as an alloy, or simply as a heteroepitaxial layer. "Dopants" can refer to either impurities or electrical dopants, such as phosphorous, arsenic, boron, or the like. The term "silicon-containing material" and similar terms are used herein to refer to a broad variety of silicon-containing materials, including without limitation, silicon (including crystalline silicon), carbon-doped silicon ("Si:C"), silicon germanium ("SiGe"), and carbon-doped silicon germanium ("SiGe:C"). As used herein, "carbon-doped silicon", "Si:C", "silicon germanium", "SiGe," "carbon-doped silicon germanium", "SiGe:C" and similar terms refer to materials that contain the indicated chemical elements in various proportions and, optionally, minor amounts of other elements. For example, "silicon germanium" is a material that comprises silicon, germanium and, optionally, other elements, for example, dopants such as carbon and electrically active dopants. Shorthand terms such as "Si:C" and "SiGe:C" are not stoichiometric chemical formulas per se and thus are not limited to materials that contain particular ratios of the indicated elements. Furthermore, terms such as Si:C and SiGe:C are not intended to exclude the presence of other dopants, such that a phosphorous and carbon-doped silicon material is included within the term Si:C and the term Si:C:P. The percentage of a dopant, such as carbon or germanium, in a silicon-containing film is expressed herein in atomic percent on a whole film or sub-film basis, unless otherwise stated. It will be understood that the concentration of impurity dopants, such as carbon or germanium, but excluding other elements, such as electrical dopants, in a silicon-containing film, as described herein, is at least about 0.3 atomic %. The skilled artisan will understand, however, that electrical dopants can induce strain in layers and thus may also be included in such layers.

It is possible to determine the amount of impurity, such as germanium or carbon, substitutionally doped into a silicon-containing material, for example, by measuring the perpendicular lattice spacing of the doped silicon-containing material by x-ray diffraction, then applying Vegard's Law by performing a linear interpolation between single crystal silicon and single crystal germanium for SiGe alloys or applying the Kelires/Berti relation for carbon within Si:C alloys. Additional details on this technique are provided in the Hoyt article. Secondary ion mass spectrometry ("SIMS") can be used to determine the total impurity content in the doped silicon. It is possible to determine the non-substitutional or interstitial impurity content by subtracting the substitutional impurity content from the total impurity content. The amount of other elements substitutionally doped into other silicon-containing materials can be determined in a similar manner.

"Substrate," as that term is used herein, refers either to the workpiece upon which deposition is desired, or the surface exposed to one or more deposition gases. For example, in certain embodiments, the substrate is a single crystal silicon wafer, a semiconductor-on-insulator ("SOI") substrate, or an epitaxial silicon surface, a silicon germanium surface, or a III-V material deposited upon a wafer. Workpieces are not limited to wafers, but also include glass, plastic, or other substrates employed in semiconductor processing. In the illustrated embodiments, the substrate has been patterned to have two or more different types of surfaces. In certain embodiments, silicon-containing layers are selectively formed over single crystal semiconductor materials while minimizing, and more preferably avoiding, deposition over adjacent dielectrics or insulators. In other embodiments, deposition occurs epitaxially over single-crystal semiconductor surfaces while depositing amorphous or polycrystalline material over adjacent insulators. Examples of dielectric or insulator materials include silicon dioxide, including low dielectric constant forms, such as carbon-doped and fluorine-doped oxides of silicon, silicon nitride, metal oxide and metal silicate.

The terms "epitaxial," "epitaxially," "heteroepitaxial," "heteroepitaxially" and similar terms are used herein to refer to the deposition of a crystalline silicon-containing material onto a crystalline substrate in such a way that the deposited layer adopts or follows the lattice constant of the underlying layer or substrate. Epitaxial deposition is heteroepitaxial when the composition of the deposited layer is different from that of the underlying layer or substrate. Epitaxial deposition is homoepitaxial when the composition of the deposited layer is the same as that of the underlying layer or substrate.

In certain applications, a patterned substrate has a first surface having a first surface morphology and a second surface having a second surface morphology. Even if surfaces are made from the same elements, the surfaces are considered different if the morphologies or crystallinity of the surfaces are different. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by an in-plane crystal structure and orientation that is identical to the substrate upon which they are grown, typically single crystal. The atoms in these materials are arranged in a lattice-like structure that persists over relatively long distances on an atomic scale. Amorphous morphology is a non-crystalline structure having a low degree of order because the atoms lack a definite periodic arrangement. Other morphologies include microcrystalline and mixtures of amorphous and crystalline material. "Non-epitaxial" thus encompasses amorphous, polycrystalline, microcrystalline and mixtures of the same. As used herein, "single-crystal" or "epitaxial" are used to describe a predominantly large crystal structure having a tolerable number of faults therein, as is commonly employed for transistor fabrication. The crystallinity of a layer generally falls along a continuum from amorphous to polycrystalline to single-crystal; a crystal structure is often considered single-crystal or epitaxial despite low density faults. Specific examples of mixed substrates having more than two different types of surfaces, whether due to different morphologies and/or different materials, include without limitation: single crystal/polycrystalline, single crystal/amorphous, epitaxial/polycrystalline, epitaxial/amorphous, single crystal/dielectric, epitaxial/dielectric, conductor/dielectric, and semiconductor/dielectric. Methods described herein for depositing silicon-containing films onto mixed substrates having two types of surfaces are also applicable to mixed substrates having three or more different types of surfaces.

When grown into recessed source/drain areas to thicknesses below its critical thickness, tensile strained silicon-containing material induces uniaxial tensile strain into the silicon channel adjacent to the recessed source/drain areas. Such tensile strained materials include, without limitation, carbon-doped silicon films (Si:C films) and carbon-doped silicon germanium films (SiGe:C films in which the germanium concentration is less than about 8-10× the carbon concentration), causing enhanced electron mobility, which is particularly beneficial for NMOS devices. This eliminates the need to provide a relaxed silicon germanium buffer layer to support the strained silicon layer. In such applications, electrically active dopants are incorporated by in situ doping, using dopant sources or dopant precursors. Typical n-type dopant sources include arsenic vapor and dopant, hydrides, such as phosphine and arsine. Silylphosphines, for example $(H_3Si)_{3-x}PR_x$, and silylarsines, for example, $(H_3Si)_{3-x}AsR_x$, where x=0, 1 or 2 and $R_x$=H and/or deuterium (D), are alternative precursors for phosphorous and arsenic dopants. Phosphorous and arsenic are particularly useful for doping source and drain areas of NMOS devices. $SbH_3$ and trimethylindium are alternative sources of antimony and indium, respectively. Such dopant precursors are useful for the preparation of films as described below, preferably phosphorous-, antimony-, indium-, and arsenic-doped silicon, Si:C, and SiGe:C films and alloys.

When grown into recessed source/drain areas to thicknesses below the critical thickness, compressively strained silicon-containing material induces uniaxial compressive strain in the silicon channel adjacent to the recessed source/drain areas, causing enhanced hole mobility, which is particularly beneficial for PMOS devices. Such compressively strained materials include, without limitation, silicon germanium films ("SiGe films") and carbon-doped silicon germanium films ("SiGe:C films") in which the germanium concentration is greater than about 8-10× the carbon concentration. In such applications, electrically active dopants are incorporated by in situ doping, using dopant sources or dopant precursors. Typical p-type dopant precursors include diborane ($B_2H_6$) and boron trichloride ($BCl_3$) for boron doping. Other p-type dopants for Si include Al, Ga, In, and any metal to the left of Si in the Mendeleiev table of elements. Such dopant precursors are useful for the preparation of films as described below, preferably boron-doped silicon, SiGe, and SiGe:C films and alloys.

There are limits on the thickness of the layer of SiGe or Si:C that can be grown in recessed source and regions without excessive dislocations. The thickness of the layer that can be grown is generally inversely proportional to the impurity content. Currently, SiGe alloys of uniform composition and thicknesses in the range of about 10-50 nm can be deposited with acceptable dislocation amounts for SiGe with less than about 40 atomic % Ge and Si:C with less than about 3 atomic % C. Beyond these limits, the allowable thickness of the layer and growth rates decrease dramatically as the process temperature is decreased in order to inhibit dislocation nucleation. For example, typically, only a few monolayers of pure Ge can be grown on silicon without dislocation. Beyond the critical thickness, a significant amount of dislocation, which is detrimental to the performance of the device, is produced in the layer. High overall impurity content can cause dislocations. In the preferred embodiments described herein, overall impurity content in a stressor is reduced while still maximizing the effects of strain by localizing it at the sidewalls of recesses adjacent the transistor channel.

Techniques have now been developed for forming a strained film comprising a silicon-containing material, such as Si:C, SiGe, and SiGe:C, in exposed semiconductor windows. In the illustrated embodiments, the strained films are deposited into recessed source/drain regions to exert stress on an adjacent channel region, and are therefore also referred to as "stressors." According to preferred embodiments, strained heteroepitaxial semiconductor material is deposited in recessed source/drain regions to increase the strain induced on an adjacent transistor channel region relative to the overall stress induced in the substrate. Because the stressors have different compositions at different regions within the recesses, the stressors are graded, but grading can be either continuous or stepwise in two or more discrete layers.

Graded Stressor with Maximum Strain at Surface Extending to Recess Sidewall

FIGS. 1-5D illustrate an embodiment in which the deposition of the heteroepitaxial stressor material is conducted in a bottom-up fashion and graded such that the highest strain is at the top surface and extends to the sidewall of the recess. For example, it is possible to accomplish such formation by (a) blanket depositing a Si:C film into a recess, and (b) selectively etching the semiconductor material from sidewalls of the recesses, leaving a heteroepitaxial layer at the bottom of the recess. Step (b) can simultaneously etch non-epitaxial semiconductor material over insulators. Steps (a) and (b) are optionally repeated cyclically with different impurity levels and thus different levels of strain until a target epitaxial film thickness over the recessed source/drain regions is achieved. In alternative embodiments, other deposition techniques can be used to form a vertically graded silicon-containing material in recesses of a substrate.

It is possible to form recessed source/drain regions by dry etching with subsequent HF cleaning and in situ anneal. In embodiments wherein a dry etch is used, deposition of a selectively grown, thin (between approximately 1 nm and approximately 3 nm) silicon seed layer helps reduce etch damage. A seed layer also helps to cover damage caused by prior dopant implantation processes. In an example embodiment, such a seed layer might be selectively deposited using simultaneous provision of HCl and dichlorosilane at a deposition temperature between about 700° C. and about 800° C.

In accordance with certain embodiments, a cyclical blanket deposition and etch process is illustrated in the flowchart provided in FIG. 1, and in the schematic illustrations of the partially formed semiconductor structures illustrated in FIG. 2 through FIG. 5E. While discussed below in the context of an embodiment for tensile strained Si:C deposition by a particular cyclical process, it will be appreciated that bottom-up, graded filling of recesses, as described herein, can be used in the formation of epitaxial films for other strained materials formed in a bottom-up fashion by other techniques. The Si:C embodiment preferably includes between about 0.1 atomic % and 4 atomic %, and preferably in the range of between about 1 atomic % and 3 atomic % substitutional carbon and is graded to have the highest strain near the substrate surface. The skilled artisan will understand that the preferred cyclical process can selectively form Si:C with higher carbon concentrations for a given film quality than possible with simultaneous etchant and precursor flow for conventional selective deposition, and also allows the portion of the stressor with the highest strain at the top of the recess to extend to the recess wall adjacent the channel. It will be understood that, in some implementations, the recess wall might be defined by an epitaxial layer deposited to line the recess after the recess is etched. The techniques described herein can be used for deposition of other epitaxial films, such as SiGe and SiGe:C, in recessed source/drain regions.

In particular, FIG. 1 illustrates that a substrate having recessed source/drain regions is placed in a process chamber in operational block 10. As indicated by operational block 20, a semiconductor alloy layer is conformally deposited over the substrate. In one embodiment, this conformal deposition is a blanket deposition that leaves amorphous or polycrystalline material over any insulator regions of the substrate and epitaxial deposition over the bottom and sidewalls of the source/drain regions. After the conformal deposition, any regions of amorphous or polycrystalline material and the sidewall epitaxial material are selectively etched, as indicated by operational block 30. After the selective etch, it is determined whether the target thickness of epitaxial film in the recessed source/drain regions is achieved, as shown by operational block 40. If the target thickness has been achieved, the process is ended, as shown in operational block 45. If the target thickness has not been achieved, the process continues cyclically by incrementing or increasing the strain-inducing impurity concentration, such as carbon, as indicated at operational block 50. This increased concentration is used for the next conformal deposition of the semiconductor alloy layer, which is indicated by operational block 20. The next conformal deposition with the increased impurity concentration is followed by selective etch of any amorphous or polycrystalline and sidewall epitaxial material, as shown in operational block 30. After this deposition and etch process, the epitaxial film in the recessed source/drain thickness is evaluated to determine whether the target thickness has been achieved, as shown in operational block 40. This cyclical process is repeated until the target thickness is achieved. At least two cycles 20-50 are conducted in order to achieve a graded stressor.

Figure 2:
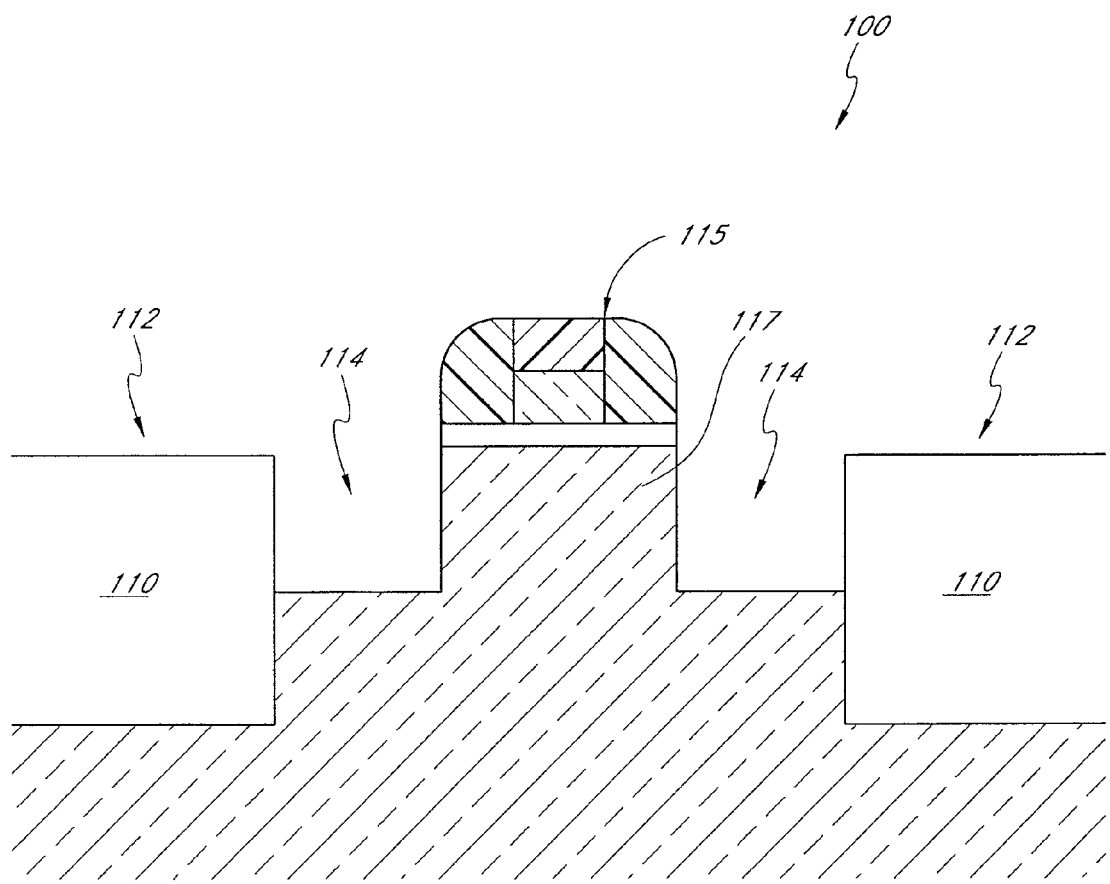
FIG. 2 is a schematic cross-sectional illustration of a partially formed semiconductor structure including recessed source/drain regions formed in a semiconductor substrate.

FIG. 2 provides a schematic illustration of an exemplary substrate that includes a patterned insulator 110 formed in a semiconductor substrate 100, such as a silicon wafer. The illustrated insulator 110, in the form of oxide-filled shallow trench isolation (STI), defines field isolation regions 112 and is adjacent recessed source/drain regions 114 shown on either side of a gate electrode 115 structure. Note that the gate electrode 115 overlies a channel region 117 of the substrate. Together, the channel 117, source and drain regions 114 define a transistor active area, which is typically surrounded by field isolation 112 to prevent cross-talk with adjacent devices. In other arrangements, multiple transistors can be surrounded by field isolation. In one case, the top of the gate structure 115, can be capped with a dielectric material. This surface then behaves similarly to the field regions 110 with respect to the deposition thereover, and the deposition over the top of the gate will have the similar crystallinity as the deposition over the field region. In the case that the gate 115 is not capped with a dielectric material, the surface of the gate will grow polycrystalline material which then can be removed through in-situ etching of polycrystalline material, but a different set of conditions, such as pressure, gas flow, etc., might apply, for ensuring removal of material from the field 110.

An embodiment that involves the specific example of carbon-doped silicon (Si:C) for NMOS applications is described below. As illustrated schematically in FIG. 3, a blanket Si:C layer 120, 125, 130 is deposited over the mixed substrate, preferably using trisilane as a silicon precursor, and also flowing a carbon precursor. This results in predominantly amorphous or polycrystalline or non-epitaxial deposition 120 of Si:C over field isolation regions 112, and lower epitaxial deposition 125 and sidewall epitaxial deposition 130 of Si:C lining the recessed source/drain regions 114. Note that "blanket deposition" means that net deposition results over both the amorphous insulator 110 and the single crystal source/drain regions 114 in the deposition phase. While lack of etchants or halides is preferred in the blanket deposition process, in which case the deposition can also be considered "non-selective," some amount of an etchant might be desirable to tune the ratio of deposited thickness over the various regions. In case such small amounts of etchant are desirable, the deposition process may be partially selective but nevertheless blanket, since each deposition phase will have net deposition over both the insulator 110 and single crystal region 114.

Figure 4:
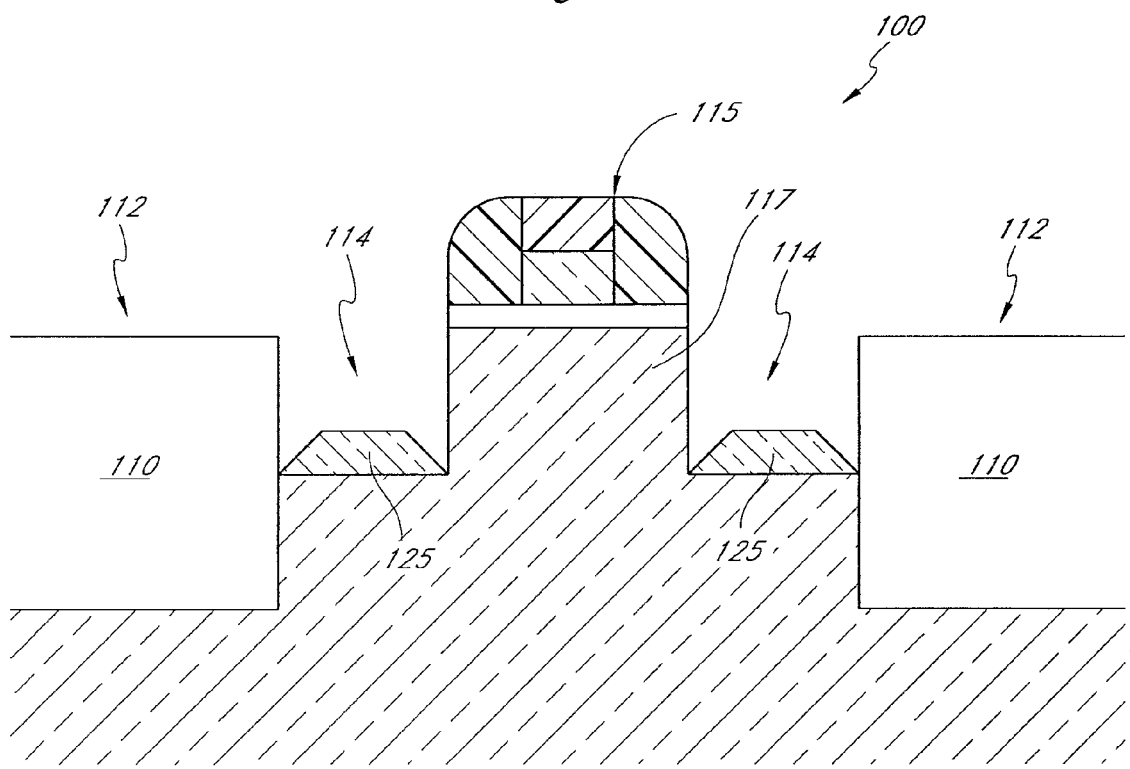
FIG. 4 is a schematic cross-sectional illustration of the partially formed semiconductor structure of FIG. 3 after performing a selective chemical vapor etch process to remove carbon-doped silicon from insulator and recessed sidewall regions.

According to an embodiment, the regions of amorphous or polycrystalline deposition 120 and the sidewall epitaxial deposition 130 are then selectively etched, thus resulting in the structure that is schematically illustrated in FIG. 4. In another embodiment, the deposition on the sidewall region could be polycrystalline or amorphous material. While some epitaxially deposited Si:C is removed from the lower epitaxial layer 125 in the recessed source/drain regions 114 during the selective etch, at least some of the lower epitaxial layer 125 remains. The sidewall epitaxial layer 130 grows over a different crystallographic plane and is also more defective than the lower epitaxial layer 125 due to a growth rate differential on the two surfaces. The skilled artisan will appreciate that the lattice spacing in the vertical sidewall epitaxial layer 130 is smaller than that in the lower epitaxial layer 125, which results in the growth rate differential on the two surfaces. Accordingly, the sidewall epitaxial layer 130 is more readily removed, along with the non-epitaxial material 120. Thus, each cycle of the process can be tuned to achieve largely bottom-up filling of the recesses 114. As will be appreciated from the discussion of FIG. 1, each cycle includes blanket conformal deposition 20 and selective etching 30 from the recess sidewalls.

As discussed in more detail below, in exemplary embodiments, the vapor etch chemistry preferably comprises a halide, such as fluorine-, bromine- or chlorine-containing vapor compounds, and particularly a chlorine source, such as HCl or $Cl_2$. In some embodiments, the etch chemistry also contains a germanium source, such as a germane like a monogermane ($GeH_4$), $GeCl_4$, metallorganic Ge precursors, or solid source Ge. The skilled artisan will appreciate that the same etch chemistries are also suitable for SiGe and SiGe:C films.

Figure 3:
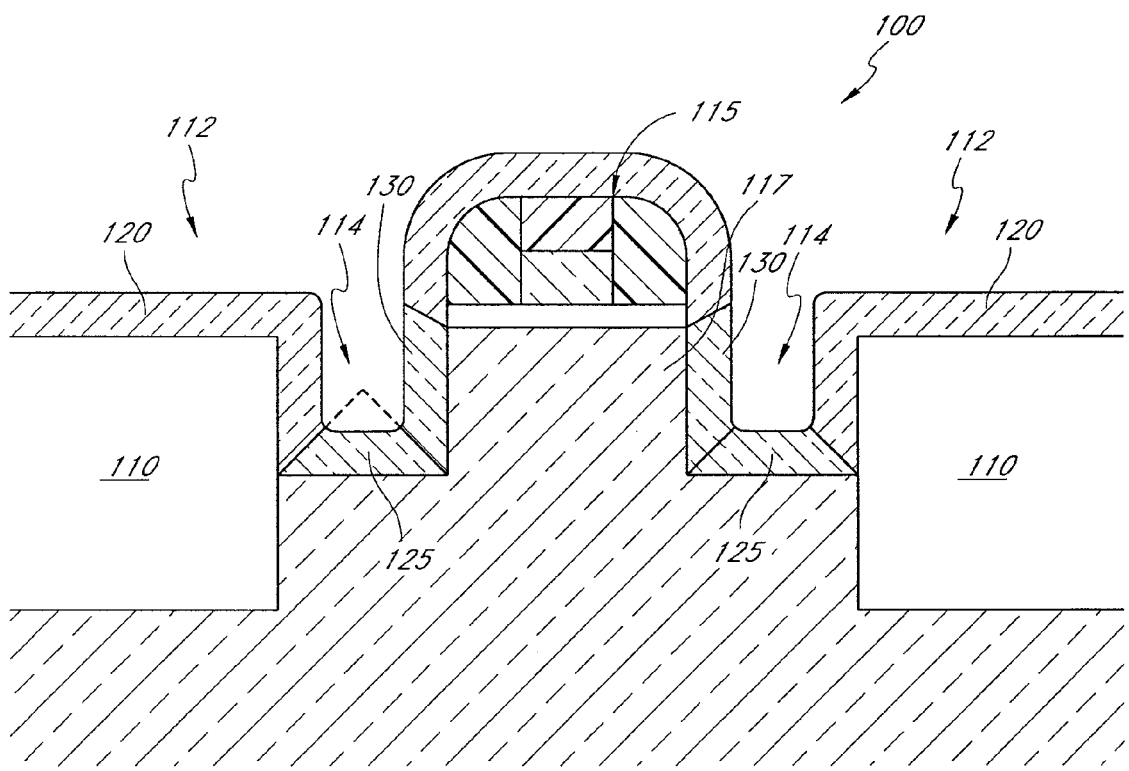
FIG. 3 is a schematic cross-sectional illustration of the partially formed semiconductor structure of FIG. 2 after performing a blanket deposition of a carbon-doped silicon film including epitaxial deposition on bottoms of the recessed source/drain regions.
Figure 5A:
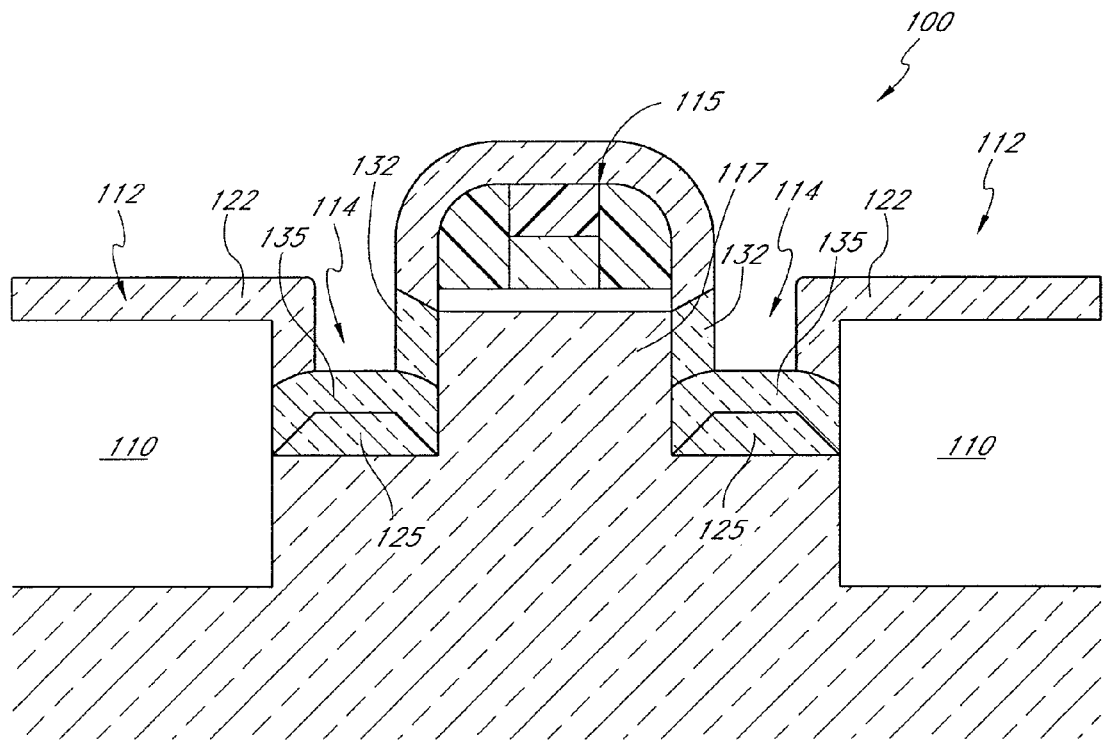
FIGS. 5A-5D are schematic cross-sectional illustrations of the partially formed semiconductor structure of FIG. 4 after performing further cycles of blanket deposition and selective etch, depositing layers of increasing strain in a bottom-up fashion.
Figure 5B:
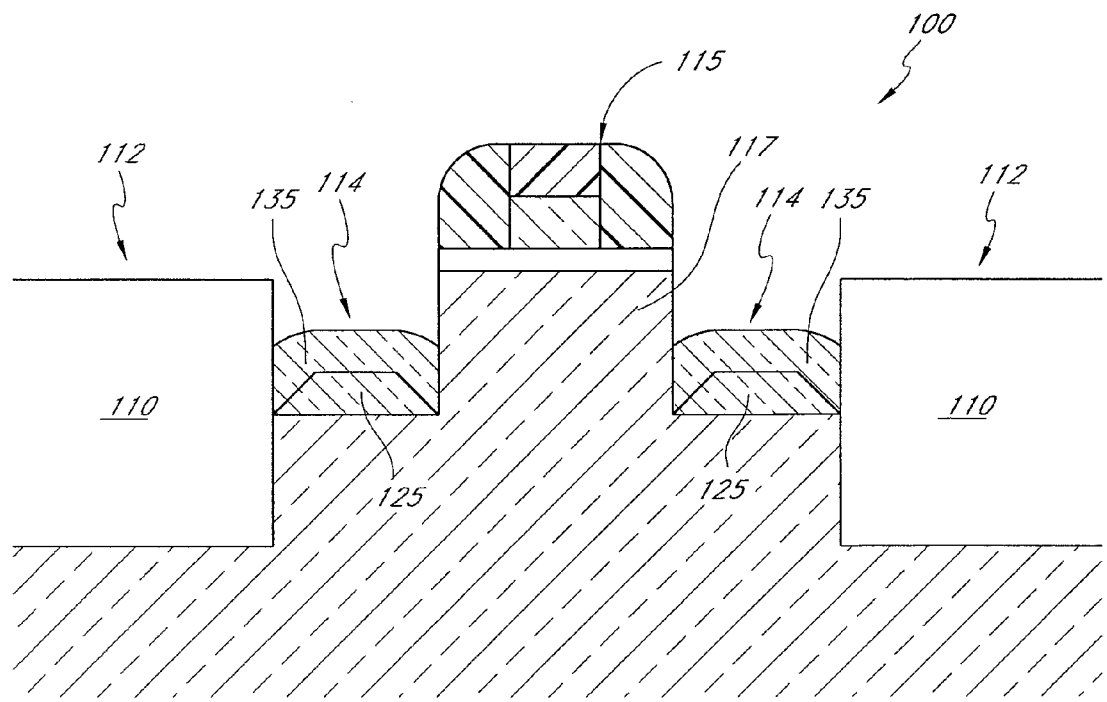

After the selective etch process described above with respect to FIG. 4, a second blanket Si:C layer 122, 132, 135 is then deposited over the mixed substrate, as shown in FIG. 5A. This second blanket Si:C layer 122, 132, 135 contains a higher carbon concentration than the first blanket Si:C layer 120-130, as shown in FIG. 3. According to an embodiment, the carbon concentration of the first blanket Si:C layer 120, 125, 130 is between about 1 atomic % and 1.5 atomic %, and the carbon concentration of the second blanket Si:C layer 122, 132, 135 is greater than about 1.5 atomic %, and preferably in a range of about 1.5 atomic % to 4 atomic %. In an alternative embodiment for growth of SiGe films, the germanium concentration of a first blanket SiGe layer 120, 125, 130 is in a range of 10 atomic % to 20 atomic %, and preferably about 15 atomic %; the germanium concentration of the second blanket SiGe layer 122, 132, 135 is in a range of 20 atomic % to 100 atomic %, and preferably in a range of about 30 atomic % to 60 atomic %. As shown in FIG. 5A, the second blanket Si:C layer 122, 132, 135 includes amorphous or polysilicon portions 122, the sidewall epitaxial portions 132 and the recess bottom surface portions 135. This second layer of Si:C 122, 132, 135 is then selectively etched to remove the non-epitaxial portions of the Si:C over the amorphous insulators 110 in the oxide regions 112 as well as the sidewall epitaxial layer 132, as shown in FIG. 5B. In another embodiment, the sidewall deposition is amorphous or polycrystalline. In any event, the sidewall layer is more readily removed than the bottom epitaxial material for this embodiment.

Figure 5C:
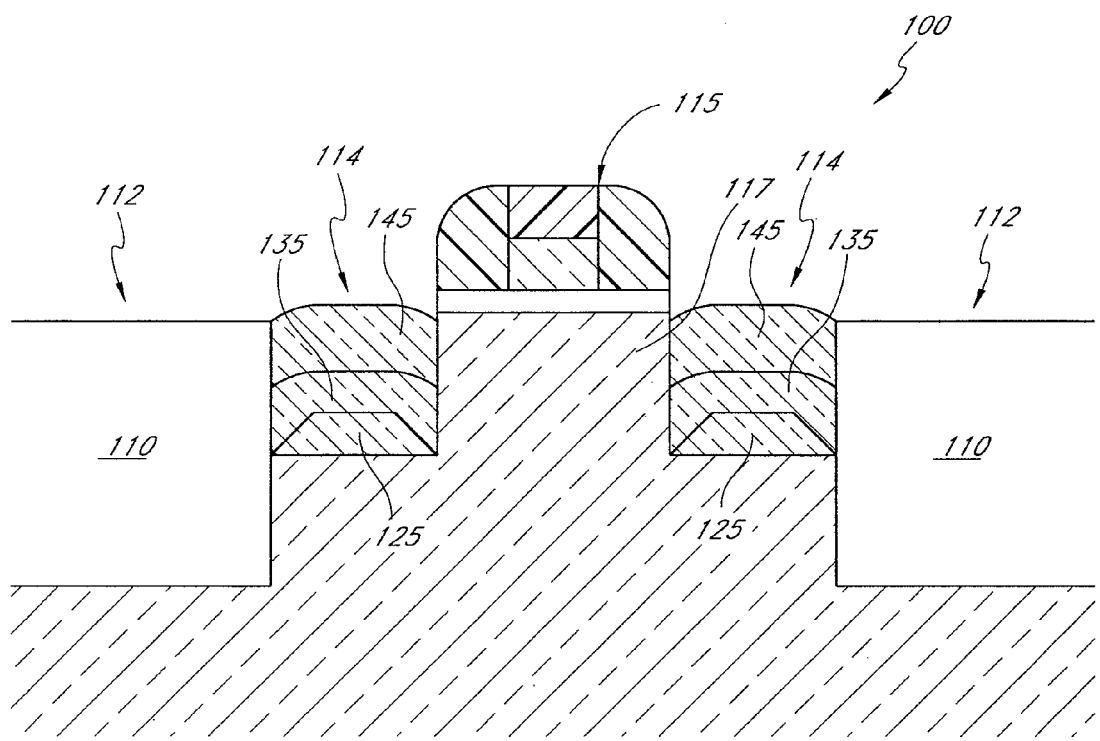

This cyclical process, including blanket deposition of a Si:C layer having a progressively higher carbon concentration followed by a selective etch process, is repeated until a target thickness of epitaxial Si:C film thickness is achieved over the recessed source/drain regions 114, as indicated by decisional block 40 shown in FIG. 1. This cyclical process is also schematically illustrated in FIG. 5A, which illustrates deposition of a second cycle of blanket Si:C layer 122, 132, 135, and in FIG. 5B, which shows etching of a second cycle of the amorphous or polycrystalline Si:C layer 122 and sidewall epitaxial layer 132, to leave bottom-covering epitaxial Si:C with increased thickness. The bottom-covering epitaxial Si:C with increased thickness includes discrete graded layers 125, 135 in recessed source/drain regions 114. FIG. 5C illustrates the result of a further cycle to leave epitaxial-filled source/drain regions 114, where the top layer 145 of the discrete selective graded epitaxial layers is roughly coplanar with the field oxide 110. Although illustrated as one further cycle, the skilled artisan will appreciate that additional cycles may be performed to fill the recessed source/drain regions 114.

While FIG. 5C shows three discrete graded layers, the skilled artisan will appreciate that, in other embodiments, there may be greater or fewer numbers of discrete graded layers to achieve an epitaxial-filled source/drain region having a top surface that is roughly coplanar with the field oxide. It will be understood that, in another embodiment, the discrete graded epitaxial layers 125, 135, 145 may be selectively deposited as elevated source/drain regions 114. As shown in FIG. 5C, each deposited layer covers at least a portion of the sidewall surfaces of the recessed regions 114. According to an alternative embodiment, the layers 125, 135, 145, etc. may form a continuously graded layer, with each subsequently deposited layer having a progressively higher carbon concentration. For example, each layer may be graded as deposited and/or subsequent thermal treatments may smooth out the grading by diffusion. Whether the graded layer is continuous or stepwise, the highest strain within the recessed regions 14 is at the top of the recess (approximately planar with the surface of the wafer), and each of the graded epitaxial layers 125, 135, 145, etc. extends to the recess sidewalls adjacent the channel. Thus, even at the sidewall, the grading is predominantly vertical rather than horizontal extending away from the sidewall. AS noted above, in some arrangements, the recess sidewall is defined by the etch process with optional recess clean-up or thermal smoothing step. In other arrangements, the recess sidewall is defined by a lining layer, such as a thin epitaxial layer. Each deposited layer of the graded structure can have a thickness of about 1 nm to 100 nm. According to another embodiment, each deposited layer has a thickness of about 3 nm to 50 nm. According to yet another embodiment, each deposited layer has a thickness of about 3-5 nm. In some embodiments, each of the graded epitaxial layers has the same thickness. In other embodiments, the graded epitaxial layers have different relative thicknesses.

Figure 5D:
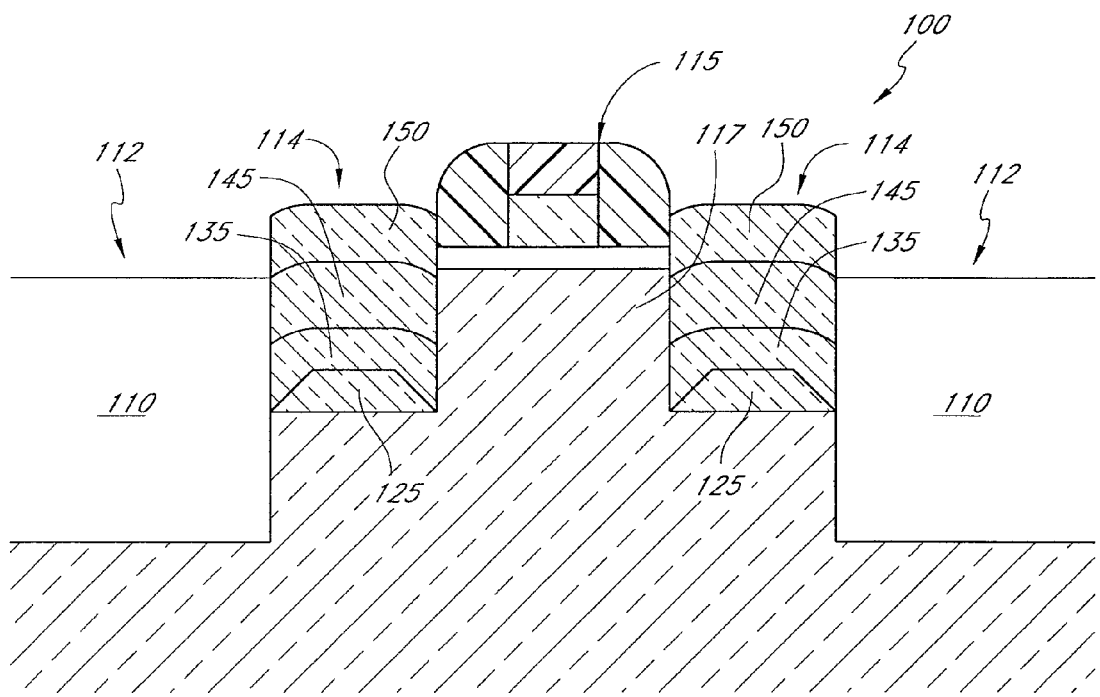

The selective formation process may further include additional cycles of blanket deposition and selective etch back to remove deposited material from dielectric regions to form an optional capping layer 150, as shown in FIG. 5D. The capping layer 150 can be with or without impurities or electrical dopants. For example, the portion of the elevated source/drain regions 114 that is above the original substrate surface and above the channel 117 between the source/drain regions 114 can be carbon-free, because this portion does not contribute to the strain on the channel 117 as it is above the level of the channel 117. Thus, the optional capping layer 150 can be formed of Si, SiGe, SiGe:C, or Si:C, and can serve to provide extra Si for contact silicidation. In one embodiment, the layers 125, 135, 145 can be formed of Si:C while the capping layer 150 is formed of Si, SiGe, SiGe:C, or Si:C. In another embodiment, the layers 125, 135, 145 can be formed of SiGe while the capping layer 150 is formed of Si, SiGe, SiGe:C, or Si:C. In an exemplary embodiment, the deposited graded Si:C layers optionally include an electrically active dopant, particularly one suitable for NMOS devices, such as phosphorous or arsenic.

In one embodiment, to aid in maintaining high concentrations of substitutional carbon and electrically active dopants, while at the same time minimizing temperature ramp/stabilization times, the substrate temperature, at least during the etch phases 30 of FIG. 1, is preferably kept low, for example, in a range between about 350° C. and 700° C. Using a low temperature for the etch also reduces the likelihood that electrically active dopant atoms are deactivated during the etch. For example, etching with $Cl_2$ gas advantageously allows the etch temperature to be reduced, thus helping to maintain the substitutional carbon and electrically active dopants. Low temperatures for the etch phase enables roughly matching deposition phase temperatures while taking advantage of the high dopant incorporation achieved at low temperatures. Etch rates can be enhanced to allow these lower temperatures without sacrificing throughput by including a germanium source, such as, for example, $GeH_4$, $GeCl_4$, metallorganic Ge precursors, solid source Ge, during the etch phase, or by flash ramping the temperature during the etch phases to improve throughput. Isothermal processing, where the setpoint temperature remains relatively constant, for example, within ±10° C., throughout the cycles improves throughput and minimizes time for temperature ramping and stabilization. Similarly, both blanket deposition and etching process are preferably isobaric, with pressure setpoints within ±20 Torr of one another. Isothermal and/or isobaric conditions facilitate better throughput for avoiding ramp and stabilization times.

As illustrated in FIG. 1, the two-stage process of performing a blanket deposition followed by a selective etch is optionally repeated cyclically until a target epitaxial film thickness filling the source/drain recesses is achieved. Example process parameters for stabilizing and one cycle are summarized in Table A below, which lists both exemplary operating points as well as preferred operating ranges in parentheses. As is evident from Table A, the process conditions—such as chamber temperature, chamber pressure and carrier gas flow rates—are preferably substantially similar for the deposition and the etch phases, thereby allowing throughput to be increased. Thus, the example below employs isothermal and isobaric conditions for both phases of a cycle. Other parameters are used for subsequently deposited layers having different impurity concentrations. For example, the Si and C precursor flow may differ, or the chamber temperature may be adjusted to deposit layers having a higher impurity concentration.

TABLE A

| | stabilize chamber temp and atmosphere | pre-deposit | Deposit | post-deposit purge of process gases | pre-bake etchant stabilize | flash-bake temp spike (optional) | post-bake cool and temp stabilize |
|---|---|---|---|---|---|---|---|
| time (sec) | | 5 (2.5-7.5) | 15 (5-20) | 5 (2.5-7.5) | 5 (2.5-7.5) | 6.5 (3.0-10) | 12.5 (10-15) |
| temp (° C.) | 550 (500-650) | 550 (500-650) | 550 (500-650) | 550 (500-650) | 550 (500-650) | temp spike | 550 (500-650) |
| pressure (Torr) | 64 (50-200) | 64 (50-200) | 64 (50-200) | 64 (50-200) | 64 (50-200) | 64 (50-200) | 64 (50-200) |
| $H_2$/He (slm) | 2.0 (0.5-20) | 2.0 (0.5-20) | 2.0 (0.5-20) | 2.0 (0.5-20) | 2.0 (0.5-20) | 2.0 (0.5-20) | 2.0 (0.5-20) |
| $Cl_2$/HCl (sccm) | | | | | 200 (5-1000) | 200 (5-1000) | 200 (5-1000) |
| $Si_3H_8$ (mg/min) | | 75 (50-200) | 75 (50-200) | 75 (50-200) | | | |

TABLE A-continued

TABLE A

| | process phase | | | | | |
|---|---|---|---|---|---|---|
| | stabilize chamber temp and atmosphere | pre-deposit | Deposit | post-deposit purge of process gases | pre-bake etchant stabilize | flash-bake temp spike (optional) | post-bake cool and temp stabilize |
| CH$_3$SiH$_3$ (sccm) | | 150 (10-300) | 150 (10-300) | 150 (10-300) | | | |
| PH$_3$ (sccm) | | 50 (10-200) | 50 (10-200) | 50 (10-200) | | | |

Table A provides exemplary process parameters for depositing epitaxial Si:C films in recessed source/drain regions, as discussed above with respect to FIGS. 1-5D. Using the parameters provided in Table A, it is possible to achieve net growth rates that are preferably between about 4 nm min$^{-1}$ and about 11 nm min$^{-1}$, and more preferably between about 8 nm min$^{-1}$ and about 11 nm mink, for epitaxial Si:C:P films that are selectively deposited in recessed source/drain regions. It is also possible to achieve thin Si:C:P films with substitutional carbon content up to 3.5% as determined by applying the Kelires/Berti relation, and with resistivities between about 0.4 mΩ cm and about 2.0 mΩ cm. By manipulating the deposition conditions, it is possible to obtain other film properties. The skilled artisan will appreciate that the deposition conditions are typically adjusted for deposition of subsequent layers.

During the etch process disclosed herein, epitaxial Si:C is etched significantly slower than amorphous or polycrystalline Si:C in each etch phase with an etch selectivity in the range between about 10:1 and 30:1. Sidewall epitaxial material is also preferentially removed in the etch phases. In a preferred embodiment, the cyclical deposition and etch process conditions are tuned to reduce or eliminate net growth over the amorphous insulator 110 while achieving net growth in each cycle in the epitaxial recessed source/drain regions 114, particularly on the bottom surfaces of the recesses 114. This cyclical process is distinguishable from conventional selective deposition processes in which deposition and etching reactions occur simultaneously.

Tables B and C below give two examples of deposition and etch durations and resultant thicknesses using a recipe similar to that of Table A. The recipes are differently tuned to modulate both deposition and etch rates by increasing the partial pressure of the Si$_3$H$_8$ and optimizing etchant partial pressures.

TABLE B

| Deposition Phase | | | Etch Phase |
|---|---|---|---|
| Growth rate [nm/min] | 28 | 13 | α-etch rate [nm/min] |
| Deposition time[s] | 22 | 47.4 | Minimum etch time[s] |
| | | 60 | % overetch |
| | | 75.8 | Effective etch time[s] |
| Deposited α-thickness [nm] | 10.27 | 16.43 | Removed α thickness [nm] |
| Deposited epi-thickness [nm] per deposition step | 9.78 | 0.82 | Removed c thickness [nm] per etch step |
| α/epi growth rate ratio | 1.05 | 20 | In-situ etch selectivity |
| Purge (pre epi + post epi) [s] | 25 | 25 | Purge (pre epi + post epi) [s] |

TABLE B-continued

| Deposition Phase | Etch Phase |
|---|---|
| Final time/cycle[s] 122.8 | |
| Final thk/cycle [nm] 8.96 | |
| Average growth rate [nm/min] 4.38 | |

TABLE C

| Deposition Phase | | | Etch Phase |
|---|---|---|---|
| Growth rate [nm/min] | 80 | 25 | Etch rate [nm/min] |
| Deposition time[s] | 8 | 25.6 | Minimum etch time[s] |
| | | 30 | % overetch |
| | | 33.28 | Effective etch time[s] |
| Deposited α-thickness [nm] | 10.67 | 13.87 | Removed α thickness [nm] |
| Deposited epi-thickness [nm] per deposition step | 10.67 | 0.693 | Removed c thickness [nm] per etch step |
| α/epi growth rate ratio | 1 | 20 | In-situ etch selectivity |
| Purge (pre epi + post epi) [s] | 20 | 20 | Purge (pre epi + post epi) [s] |

Final time/cycle[s] 61.3
Final thk/cycle [nm] 9.977
Average growth rate [nm/min] 9.76

As noted above, in alternative embodiments, instead of the cyclical blanket deposition/selective etching process described above, other selective deposition techniques may be used to deposit graded stressors in the recesses in a bottom-up fill manner.

Retrograded Stressor with Maximum Strain Lining Recesses.

Figure 6:
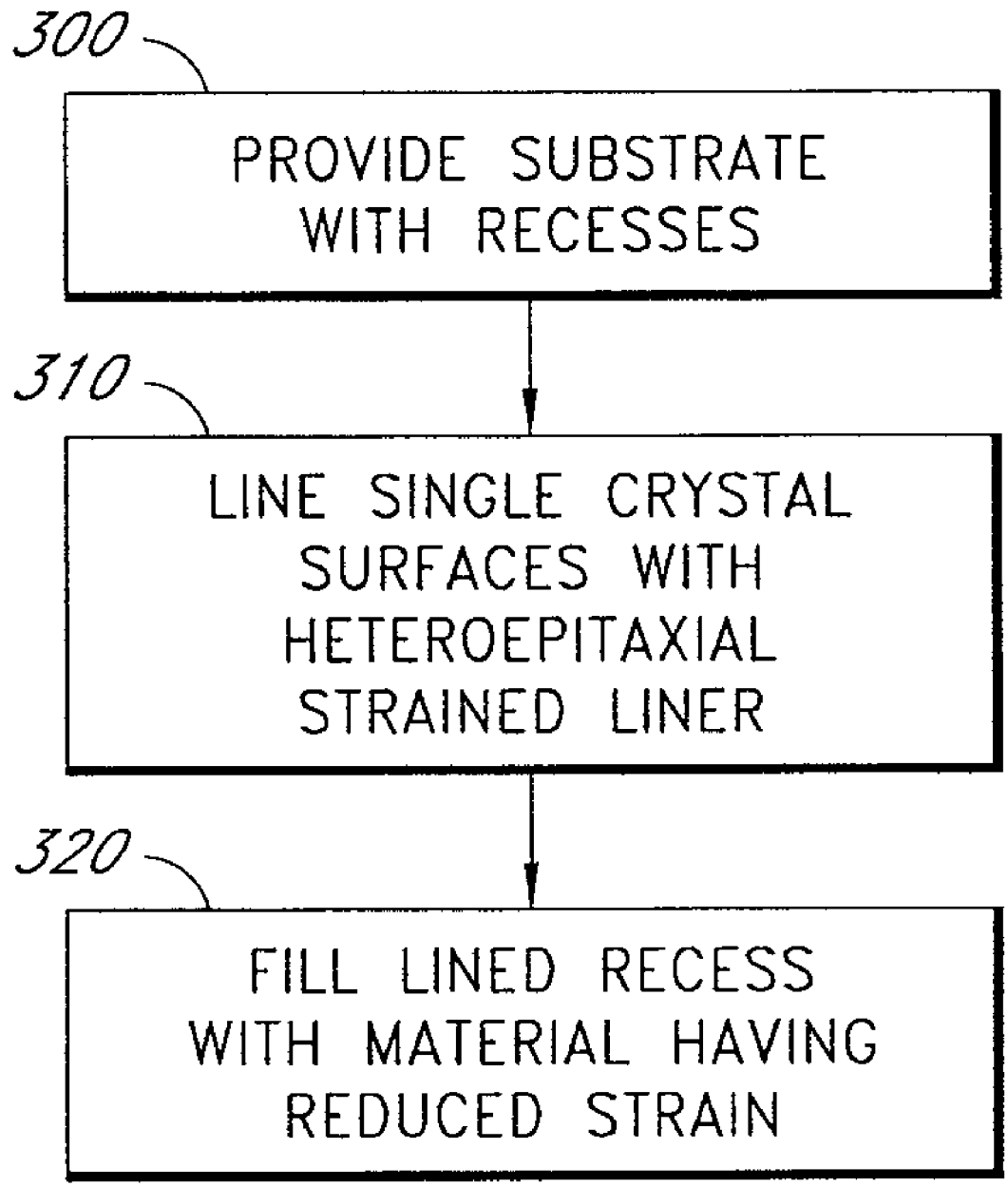
FIG. 6 is a flow chart illustrating a process for forming a strained liner layer in recessed source/drain regions of a substrate.

FIG. 6 illustrates that a substrate having recesses is provided in operational block 300. As indicated by operational block 310 in FIG. 6, the single-crystal surfaces of the substrate's recesses are lined with a heteroepitaxial strained liner. After lining the recesses, the lined recesses are filled with a material having reduced strain compared to the strained liner, as indicated by operational block 320.

Figure 7:
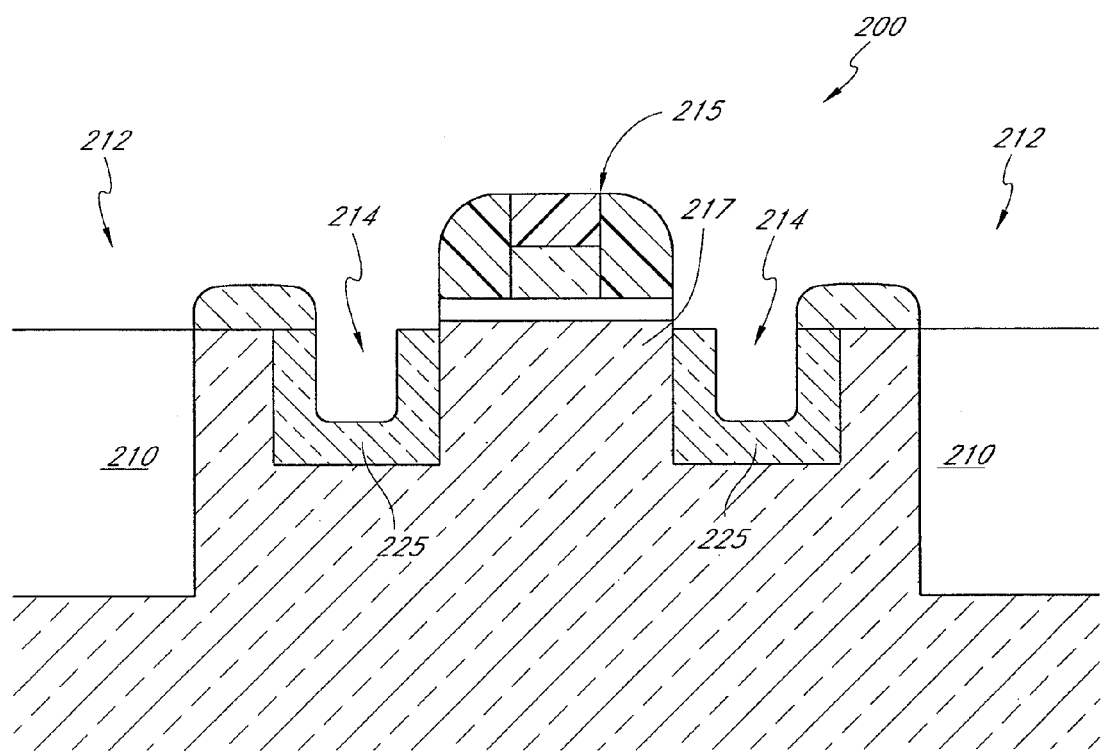
FIGS. 7-8 are schematic cross-sectional illustrations of the partially formed semiconductor structure of FIG. 2 after forming a liner layer comprising a silicon-containing film in recessed regions of a mixed substrate surface and filling the recessed regions with a filler, in accordance with another embodiment.
Figure 8:
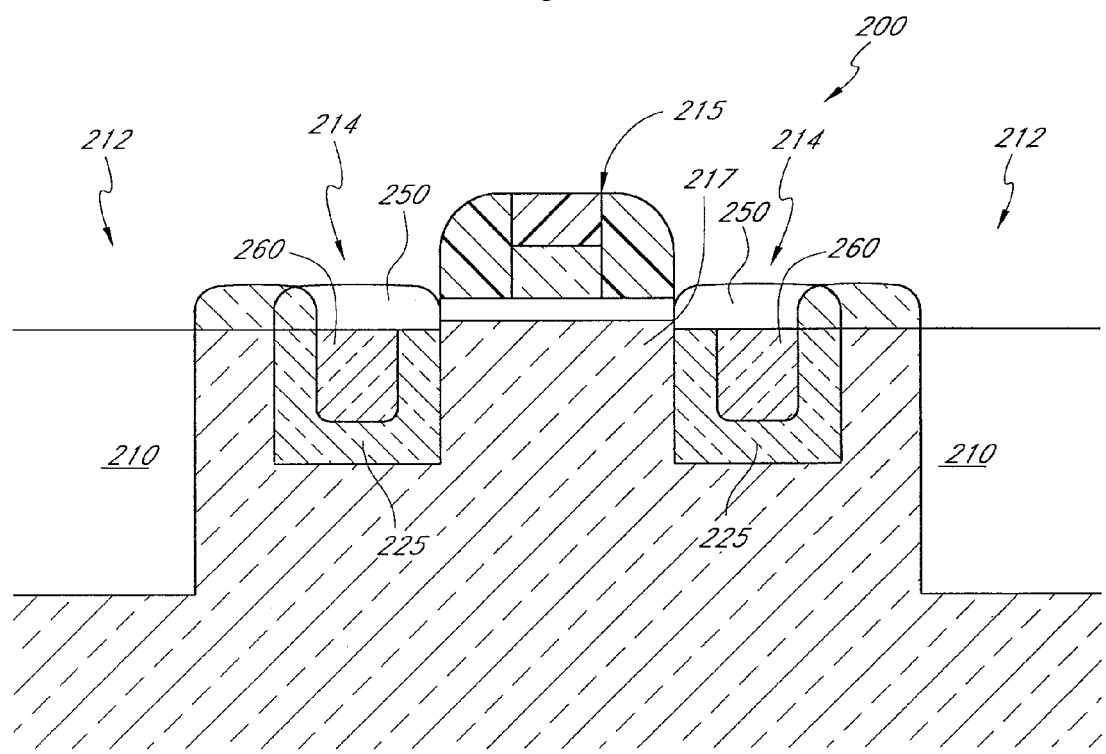

FIGS. 7-8 illustrate an embodiment of the method of FIG. 6. FIG. 7 provides a schematic illustration of an exemplary substrate that includes a patterned insulator 210 formed in a semiconductor substrate 200, such as a silicon wafer. The illustrated insulator 210, in the form of oxide-filled STI, defines field isolation regions 212 and is adjacent the recessed source/drain regions 214 shown on either side of a gate electrode 215 structure, which overlies a channel region 217 of the substrate 200. For purposes of illustration, the insulator 210 is shown separated from the recessed source/drain regions 214, such that all of the recess surfaces are defined by single-crystal silicon. It will be understood, though, that in other arrangements, some recess surfaces can be defined by insulator material, as shown in FIG. 2. A liner layer 225 of a heteroepitaxial silicon-containing material, such as SiGe, SiGe:C, and Si:C, is formed in recessed source/drain regions 214 of a substrate 200 also having insulator regions 210, as illustrated in FIG. 7. The heteroepitaxial liner layer 225 is preferably selectively and heteroepitaxially deposited on the single crystal surfaces of the recessed source/drain regions 214.

According to another embodiment, the heteroepitaxial liner layer 225 may be formed by selectively depositing a blanket layer of a silicon-containing material, such as SiGe, SiGe:C, or Si:C, over a mixed substrate having insulator regions and recessed source/drain regions and selectively etching the blanket layer such that the deposited silicon-containing material remains only in the recessed source/drain regions, as described above with respect to FIGS. 1-5D. The skilled artisan will appreciate that the blanket layer of the silicon-containing material is a substantially amorphous or polycrystalline or non-epitaxial material over the field isolation regions 212 and epitaxial material over the bottom surface of the recessed regions 214. The single-crystal sidewalls of the recessed regions 214 are also covered with the heteroepitaxial liner layer 225 of the silicon-containing material, as shown in FIG. 7. The epitaxial material over the bottom surface of the recessed regions 214 and the epitaxial material on the sidewalls together for the heteroepitaxial liner layers 225 of the recessed regions 214. After selective etching, only the heteroepitaxial liner layer 225 remains in the recessed source/drain regions 214.

As shown in FIG. 7, the heteroepitaxial liner layer 225 lines the recessed regions 214 such that the heteroepitaxial liner layer 225 covers all sidewall surfaces as well as the bottom surface of the recessed regions 214. Preferably, this heteroepitaxial liner layer 225 is substantially uniformly deposited over the exposed silicon in the recessed regions 214. The heteroepitaxial silicon-containing material of the heteroepitaxial liner layer 225 is can be deposited at a temperature in a range of about 350° C. to 1000° C., and preferably in a range of about 400° C. to 800° C. In another embodiment, the epitaxial silicon-containing material is deposited at a temperature in a range of about 400° C. to 750° C., and preferably in a range of about 450° C. to 650° C. According to another embodiment, the heteroepitaxial liner layer 225 may be a graded layer having a strain-inducing impurity concentration that reduces away from the bottom and side surfaces of the recessed regions 214. Grading may be discrete or continuous.

The remaining portions of the recessed regions 214 are then filled with a filler 260, as illustrated in FIG. 8, until a target thickness over the recessed source/drain regions 214 is achieved. The filler 260 includes an epitaxial material having a lower concentration of the impurity, such as Ge or C, that introduces strain into the heteroepitaxial liner layer 225. According to an embodiment, the filler 260 includes silicon. In the illustrated embodiment shown in FIG. 8, the filler 260 fills the recess between the insulator 210 and the channel region 217 such that the upper surface of the filler 260 is substantially coplanar with the upper surface of the insulator 210. However, the skilled artisan will readily appreciate that this target thickness can also be below or above the top surface of the insulator 210. The skilled artisan will appreciate that the filled recessed source/drain regions 214, which are filled with a stressor formed by the heteroepitaxial liner 225 and the reduced strain filler 260, are more stable than a conventional stressor with a uniform silicon alloy because the stressor has a reduced overall concentration of the strain-inducing impurity material, such as Ge or C. The structure still provides a high level of strain at the edge of the channel 217, which is desirable. For example, for a heteroepitaxial liner layer 225 comprising SiGe, the Ge content is typically between 20 atomic % and 50 atomic %, and the Ge content for the filler 260 is preferably less than about 20 atomic % or less. For a Si:C liner, the C content is typically between 0.5 atomic % and 4 atomic %, and the C content for the filler 260 is preferably less than about 1 atomic % and lower than the liner layer 225. An optional cap layer 250 may be deposited, preferably by selective deposition techniques, over the filled source/drain regions 214, as shown in FIG. 8. In one embodiment, the cap layer 250 can be formed of Si, SiGe, SiGe:C, or Si:C. The cap layer 250 preferably has a lower impurity concentration than the liner layer of epitaxial material 225.

Retrograded Stressor with Maximum Strain at Recess Sidewalls

Figure 9:
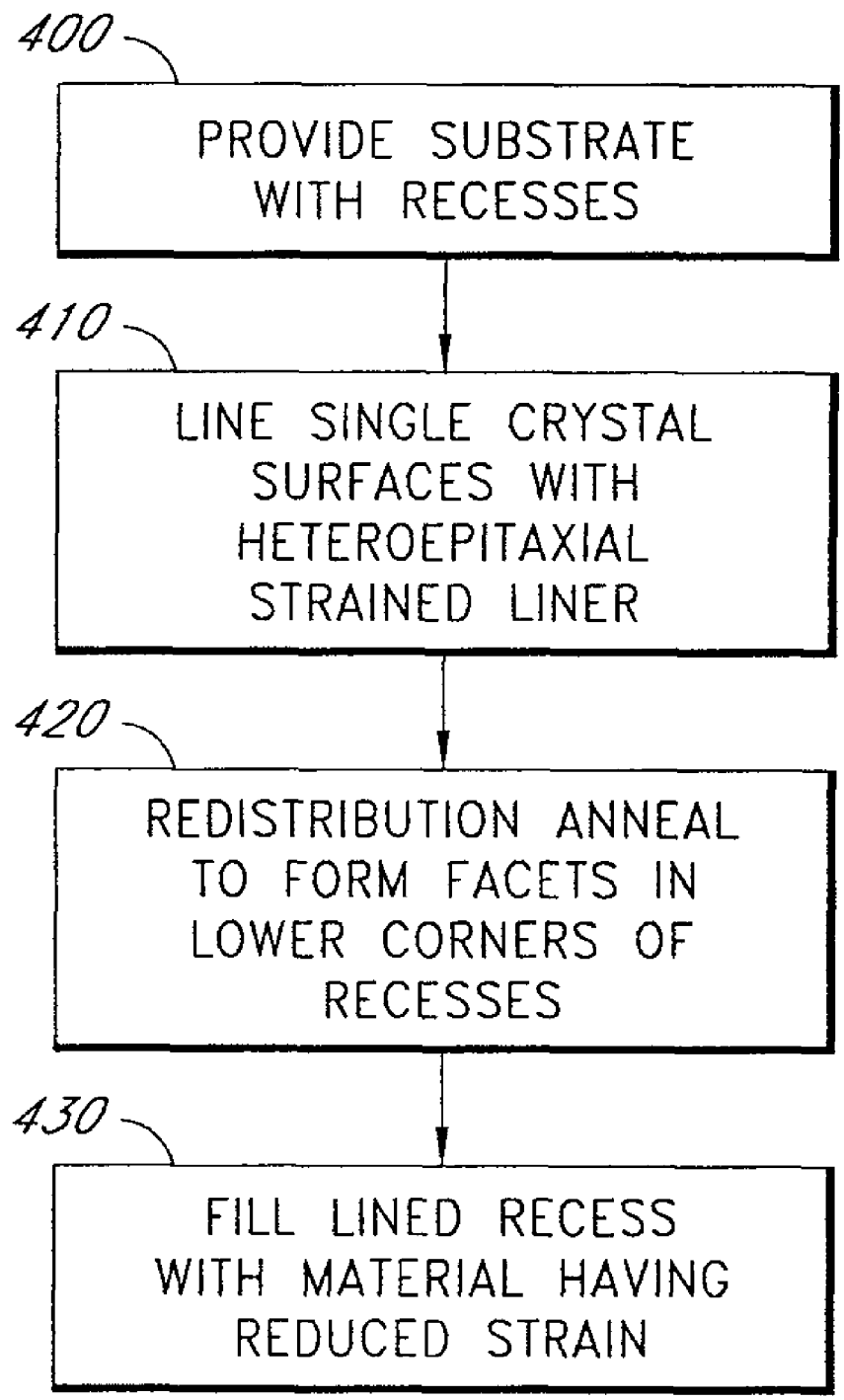
FIG. 9 is a flow chart illustrating a process for forming a faceted strained liner layer in recessed source/drain regions of a substrate.

FIG. 9 illustrates that a substrate having recesses is provided in operational block 400. As indicated by operational block 410, the single-crystal surfaces of the substrate's recesses are lined with a heteroepitaxial strained liner. After lining the recesses, a redistribution anneal is performed to form facets in the lower corners of the recess, as indicated by operational block 420. The recess is then filled with a material having reduced strain compared to the strained liner, as indicated by operational block 430.

The liner layer may be annealed to redistribute the epitaxial liner layer material such that the material migrates to corners at the sidewalls of the recesses. Typically, such an anneal causes the epitaxial material to be tapered, having a faceted side cross-sectional shape. The annealed epitaxial material is generally wider at the bottoms of the recesses than at the tops. The annealed epitaxial material, which preferably covers substantially all sidewall surface of the recesses, exerts a lateral strain on the adjacent transistor channel.

Figure 10:
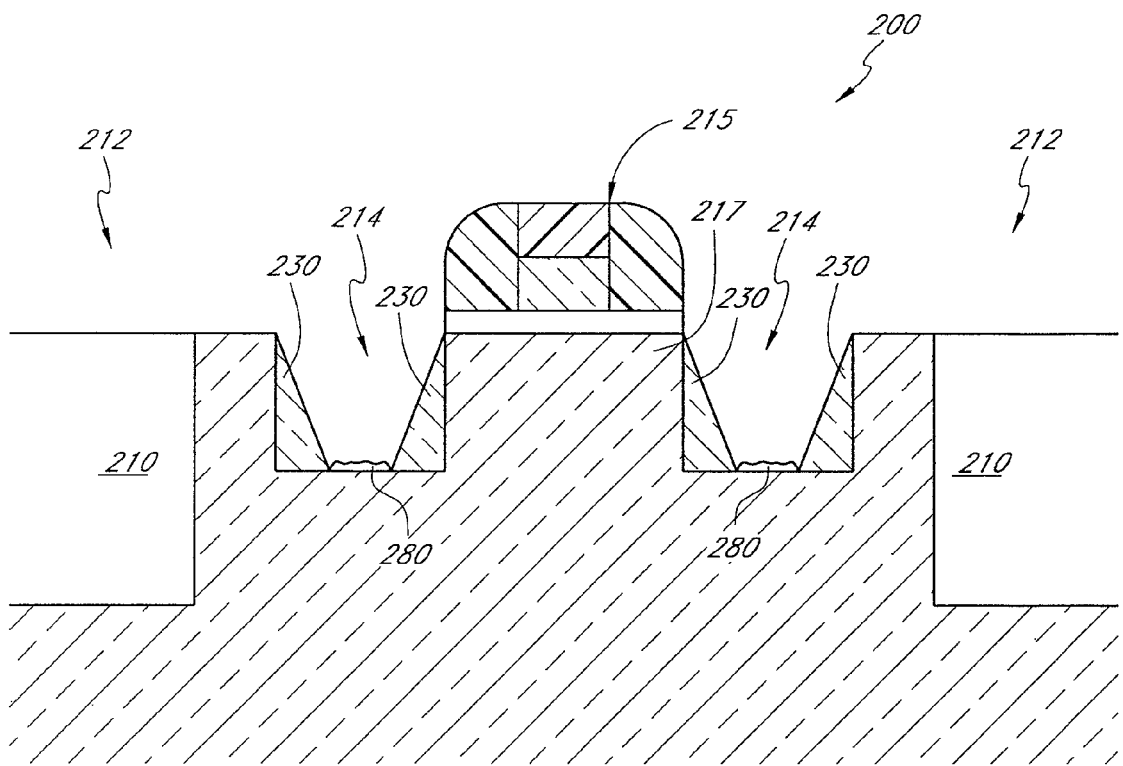
FIGS. 10-11 are schematic cross-sectional illustrations of the partially formed semiconductor structure of FIG. 6 after annealing the liner layer and filling the recessed regions with a filler, in accordance with another embodiment.
Figure 11:
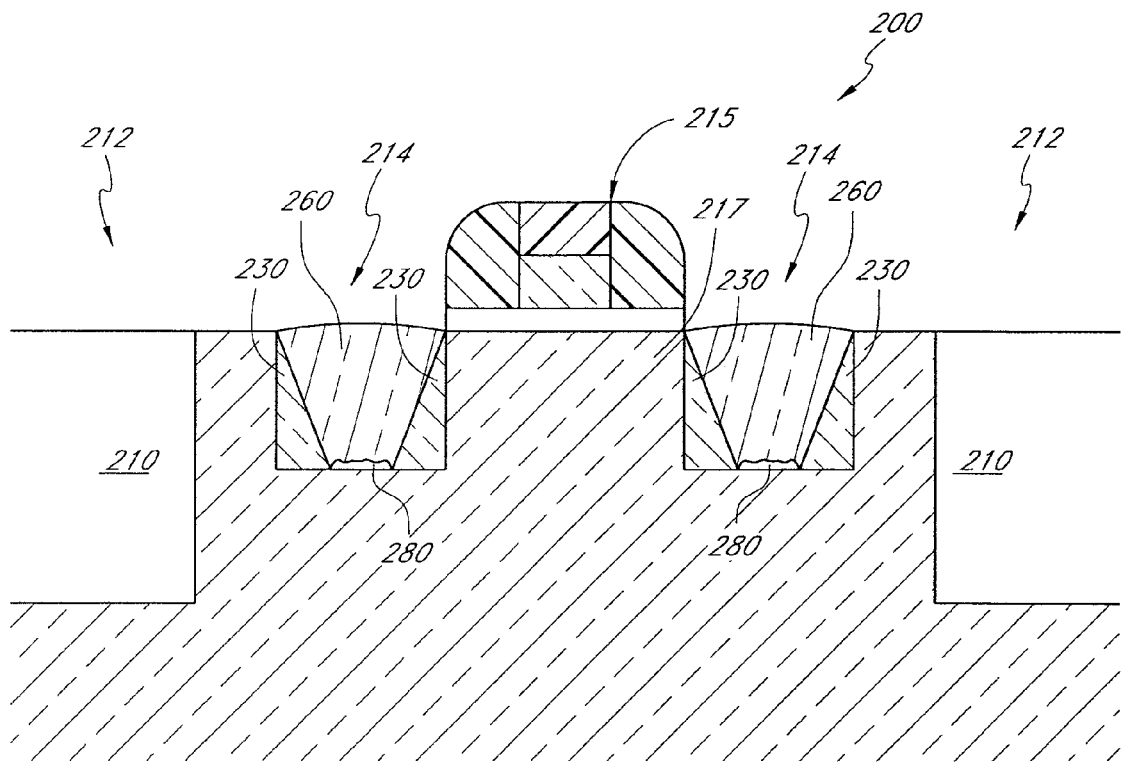

FIGS. 10-11 illustrate the method of FIG. 9. After the liner layer 225 is deposited in the structure shown in FIG. 7, whether by selective deposition techniques or cyclical blanket deposition/selective etching or non-selective deposition and patterning, the substrate 200 is then annealed by heating it to between about 600° C. and 1100° C. In one embodiment, the substrate is annealed at a temperature between about 650° C. and 900° C. In another embodiment, the anneal temperature is between about 725° C. and 775° C. The skilled artisan can readily determine an appropriate anneal duration, depending on the selected temperatures, to achieve the desired redistribution. While illustrated with the recess 214 completely defined within semiconductor material, such that the wedge-shaped hetero-epitaxial material 230 forms an annulus, the skilled artisan will appreciate that one or more sidewall surfaces can be defined by field isolation material, as illustrated for the embodiment of FIGS. 2-5D. As noted with respect to the previously described embodiments, the sidewalls of the recessed regions 214 can be defined by the etch that forms them, by subsequent cleaning or rounding steps, or additional lining layers (not shown), such as a thin epitaxial layer.

As a result of the annealing process, the silicon and dopant atoms in the liner layer 225, shown in FIG. 7, migrate and the material redistribution causes the annealed heteroepitaxial material 230 to have a faceted side cross-sectional shape, as shown in FIG. 10. From a crystallographic perspective, the faceted heteroepitaxial material 230 is the equivalent of a crystal facet on both sides of the channel region 217 underlying the gate electrode 215. As illustrated in FIG. 10, the faceted heteroepitaxial material 230 is a substantially tapered layer along the sidewall of the recessed region 214.

This faceted epitaxial material 230 is also dislocation free and strained, but has a higher alloy content than the epitaxial liner 225 of FIG. 7 prior to annealing. As illustrated, the faceted epitaxial material 230 is located adjacent the channel 217 under the gate electrode structure 215, and lines or covers substantially all of at least the recess 214 sidewall next to the channel and preferably all of the single-crystal sidewall surfaces of the recessed regions 214. Thus, the strained faceted heteroepitaxial material 230 exerts a strain on the channel region 217 underlying the gate electrode structure 215.

In the illustrated embodiment, some of the epitaxial material of the original liner 225 remains on the bottom surfaces of the recessed regions 214 after annealing. As shown in FIG. 10, the annealed epitaxial material of the bottom liner 280 is thinned, and may have an uneven surface, and may also be discontinuous with the wedge-shaped sidewall-covering hetero-epitaxial material 230. Discontinuity of the bottom coverage can reduce strain at the bottom of the recess without any effect at the top of the recess adjacent the surface of the channel. Although the annealed epitaxial material of the bottom liner 280 is isolated from the faceted heteroepitaxial material 230 in the illustrated embodiment, it will be understood that, in other embodiments (not shown), the annealed epitaxial material of the bottom liner will not be isolated from the faceted epitaxial material covering the sidewall surfaces. The isolation, or lack thereof, may be achieved by adjusting the deposition time or by the addition of a post-epitaxial deposition chemical etch step, for example, in situ post-epitaxial deposition HCl etch.

Figure 12:
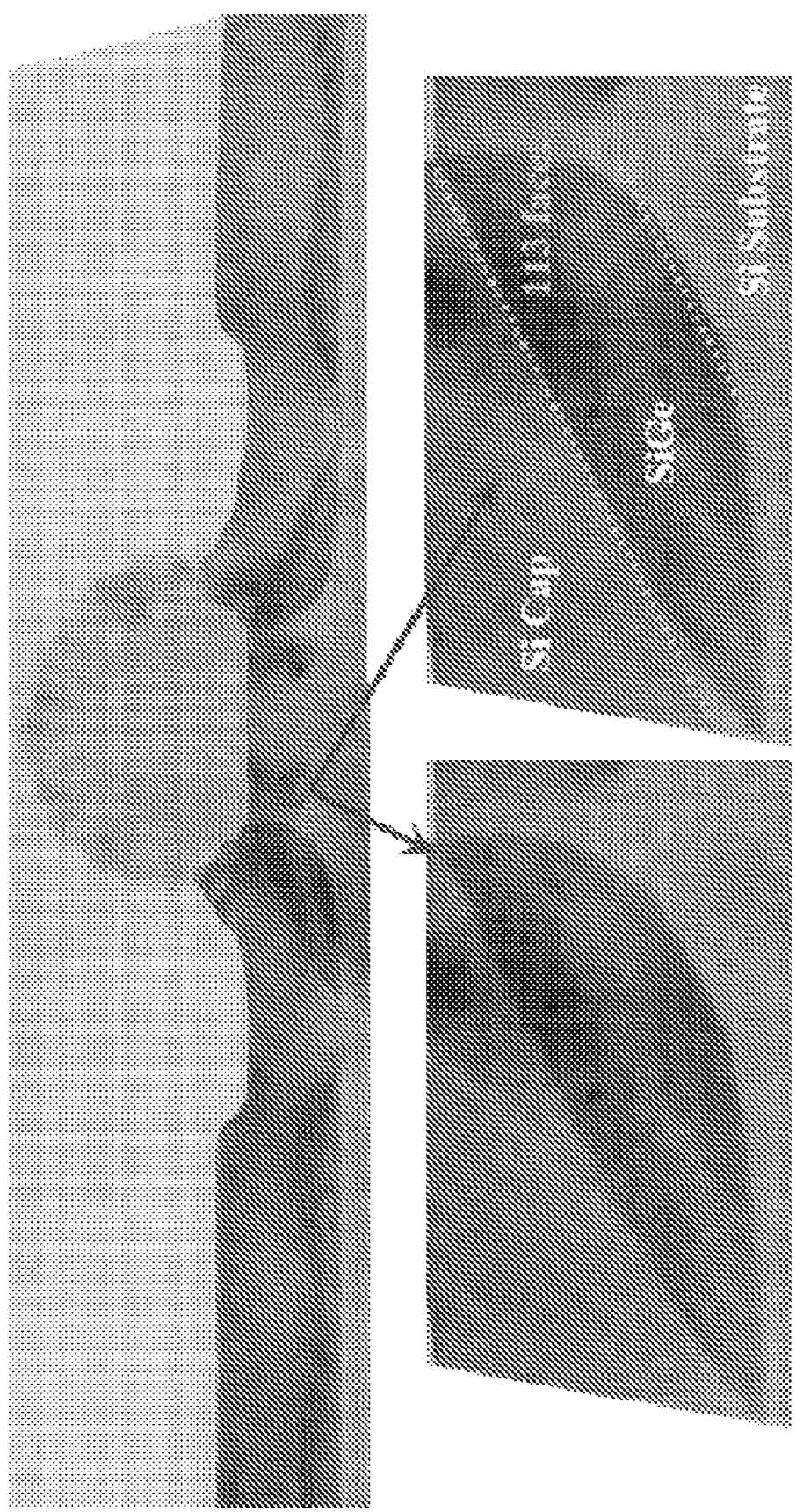
FIG. 12 is a micrograph showing an annealed SiGe liner layer.

The remaining portions of the recessed regions 214 are then filled with a filler 260, as illustrated in FIG. 11. The filler 260 has a lower strain-inducing impurity concentration than the faceted heteroepitaxial material 230. This filler layer 260 can be grown to be substantially coplanar with the top surface of the substrate 200, as shown in FIG. 11, or below or above the top surface of the substrate 200 in other embodiments. In the case of a silicon <100> substrate, the facet angle at the interface between the faceted heteroepitaxial material 230 and the filler 260 is in a range of about 25°-55°, relative to the [001] horizontal plane at the bottom of the recessed region 214. According to another embodiment, the facet angle is in a range of about 11°-72°. It will be understood that the interface between the faceted heteroepitaxial material 230 and the filler 260 may have some curvature, and that the overall stressor 230, 260 within the recessed region 214 is retrograded in the sense that there is higher strain, or higher impurity concentration, at the sidewalls and lower strain, or lower impurity concentration, in the center of the recessed region 214. Indeed, the filler 260 can be formed of Si without any strain-inducing impurity, including only electrical dopants for conductivity. An optional cap layer (not shown) may be formed over the filler 260. FIG. 12 is a micrograph showing a faceted SiGe liner layer formed using the method illustrated in FIG. 9. The filler 260 (FIG. 11) is labeled as a "Si cap" in the micrograph, and polysilicon growth is shown over the gate electrode, indicating a non-selective deposition was used for this example.

It will be understood that because the volume of the more highly strained epitaxial silicon-containing material 280, 230 is dramatically decreased by use of a thin lining layer rather than completely filling the recess with the highly strained material, the critical thickness constraint is relaxed and a substantial gain in strain engineering and thermal budget results. The impurity content of the epitaxial silicon-containing material 280, 230 can be adjusted, resulting in a different amount of strain produced. The process temperature can be increased significantly, leading to a significant increase in growth rate.

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than fabrication of semiconductor devices.

We claim:

1. A method of selectively forming semiconductor material, comprising:

providing a substrate within a chemical vapor deposition chamber, the substrate comprising insulating surfaces and single-crystal semiconductor surfaces, wherein the single-crystal semiconductor surfaces include a recess having a sidewall immediately adjacent a transistor channel; and selectively forming a semiconductor stressor in the recess, wherein the semiconductor stressor is graded such that an upper portion of the semiconductor stressor within the recess has a higher amount of strain than lower portions and wherein the upper portion of the semiconductor stressor extends within the recess to the sidewall of the recess;

wherein selectively forming comprises:

depositing semiconductor material over the insulating surfaces and the single-crystal semiconductor surfaces;

selectively removing non-epitaxial semiconductor material from the insulating surfaces, and selectively removing epitaxial material from the sidewall of the recess while leaving epitaxial material at a bottom of the recess; and repeating depositing and selectively removing in a plurality of cycles, wherein each cycle adds to a thickness of epitaxial material at a bottom of the recess and wherein a layer of semiconductor material contains a higher concentration of a dopant than an underlying layer of semiconductor material in the recess.

2. The method of claim 1, wherein the semiconductor stressor comprises discrete layers.

3. The method of claim 1, wherein depositing semiconductor material comprises blanket depositing semiconductor material over the insulating surfaces and the single-crystal semiconductor surfaces of the substrate.

4. The method of claim 3, wherein blanket depositing comprises non-selectively depositing.

5. The method of claim 3, wherein blanket depositing comprises forming predominantly amorphous semiconductor material over the insulating surfaces.

6. The method of claim 3, wherein blanket depositing comprises flowing trisilane and a carbon precursor into the chemical vapor deposition chamber.

7. The method of claim 1, wherein the semiconductor material comprises carbon-doped silicon.

8. The method of claim 1, wherein the strain is highest within the recess at a top portion of the recessed region.

9. The method of claim 1, wherein at least an uppermost layer of the semiconductor stressor is tensile strained.

10. The method of claim 3, wherein blanket depositing comprises flowing a germanium source.

11. The method of claim 3, wherein blanket depositing comprises forming predominantly polycrystalline material over the insulating surfaces.

12. The method of claim 3, wherein blanket depositing comprises flowing at least some etchant.

13. The method of claim 1, wherein selectively removing non-epitaxial semiconductor material and epitaxial semiconductor material involves introducing an etch chemistry comprising a germanium source.

14. The method of claim 13, wherein the germanium source comprises $GeCl_4$.

15. The method of claim 1, further comprising forming a silicon capping layer over the selectively formed semiconductor stressor.

* * * * *